(12) United States Patent
Yamazaki et al.

(10) Patent No.: US 10,964,729 B2
(45) Date of Patent: Mar. 30, 2021

(54) DISPLAY DEVICE AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Hideaki Shishido, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/807,213

(22) Filed: Mar. 3, 2020

(65) Prior Publication Data

US 2020/0203394 A1  Jun. 25, 2020

Related U.S. Application Data

(63) Continuation of application No. 15/818,869, filed on Nov. 21, 2017, now abandoned.

(30) Foreign Application Priority Data

Nov. 23, 2016 (JP) .............................. JP2016-227337

(51) Int. Cl.
*H01L 27/12* (2006.01)
*G02F 1/1333* (2006.01)
(Continued)

(52) U.S. Cl.
CPC ........ *H01L 27/1255* (2013.01); *G02F 1/1368* (2013.01); *G02F 1/133345* (2013.01);
(Continued)

(58) Field of Classification Search
None
See application file for complete search history.

(56) References Cited

U.S. PATENT DOCUMENTS 6,411,346 B1 * 6/2002 Numano ........... G02F 1/136213
349/39
7,674,650 B2 3/2010 Akimoto et al.
(Continued)

FOREIGN PATENT DOCUMENTS

JP 2007-096055 A 4/2007
JP 2007-123861 A 5/2007

*Primary Examiner* — Ryan Crockett
(74) *Attorney, Agent, or Firm* — Fish & Richardson P.C.

(57) ABSTRACT

A liquid crystal display device with high aperture ratio is provided. The liquid crystal display device includes a first conductive layer, a second conductive layer, and a liquid crystal element where a liquid crystal layer is positioned between a third conductive layer and a fourth conductive layer. The first to fourth conductive layers transmit visible light and include a region where the first to fourth conductive layers overlap with each other. The second conductive layer is positioned between the first conductive layer and the third conductive layer. An insulating layer is positioned between the first conductive layer and the second conductive layer. An insulating layer is positioned between the second conductive layer and the third conductive layer. Therefore, two capacitors each including the second conductive layer as an electrode are stacked. The two capacitors transmit light and overlap with the liquid crystal element; thus, aperture ratio can be increased.

6 Claims, 20 Drawing Sheets

(51) Int. Cl.
  *G02F 1/1362* (2006.01)
  *G02F 1/1368* (2006.01)
(52) U.S. Cl.
  CPC ...... *G02F 1/136213* (2013.01); *H01L 27/124* (2013.01); *H01L 27/1225* (2013.01); *G02F 2201/121* (2013.01); *G02F 2201/40* (2013.01)

(56) References Cited

U.S. PATENT DOCUMENTS

| | | | |
|---|---|---|---|
| 2011/0080549 A1* | 4/2011 | Jung | G02F 1/1345 349/141 |
| 2012/0162585 A1* | 6/2012 | Liu | H01L 27/1288 349/106 |
| 2012/0205728 A1* | 8/2012 | Yin | H01L 29/66545 257/288 |
| 2012/0287359 A1 | 11/2012 | Yamazaki et al. | |
| 2014/0070208 A1 | 3/2014 | Yamazaki | |
| 2014/0070224 A1 | 3/2014 | Yamazaki | |
| 2014/0175432 A1 | 6/2014 | Yamazaki et al. | |
| 2014/0241487 A1 | 8/2014 | Yamazaki et al. | |
| 2014/0285732 A1* | 9/2014 | Tanabe | G02F 1/1368 349/12 |
| 2015/0060845 A1 | 3/2015 | Shishido | |
| 2015/0097179 A1* | 4/2015 | Kim | H01L 27/1225 257/43 |
| 2015/0108474 A1 | 4/2015 | Yamazaki et al. | |
| 2015/0115259 A1 | 4/2015 | Yamazaki et al. | |
| 2015/0241621 A1* | 8/2015 | Inui | G02B 6/0051 349/65 |
| 2016/0043102 A1* | 2/2016 | Zhang | H01L 29/458 257/72 |
| 2016/0070131 A1 | 3/2016 | Kimura et al. | |
| 2016/0240562 A1 | 8/2016 | Miyake et al. | |
| 2016/0274699 A1 | 9/2016 | Shishido et al. | |
| 2016/0291411 A1* | 10/2016 | Bae | G02F 1/133377 |
| 2016/0313582 A1* | 10/2016 | Takano | G02F 1/133345 |
| 2016/0328080 A1 | 11/2016 | Miyake | |
| 2017/0160576 A1 | 6/2017 | Tanabe et al. | |
| 2017/0176829 A1 | 6/2017 | Son et al. | |
| 2017/0255308 A1* | 9/2017 | Li | G02F 1/133512 |
| 2017/0343871 A1 | 11/2017 | Wen | |
| 2018/0018054 A1 | 1/2018 | Kimura et al. | |
| 2018/0031877 A1* | 2/2018 | Li | G02F 1/133621 |
| 2018/0031881 A1 | 2/2018 | Kubota et al. | |
| 2018/0122914 A1* | 5/2018 | Li | H01L 29/786 |
| 2018/0321788 A1* | 11/2018 | Kimura | G02F 1/136213 |

\* cited by examiner

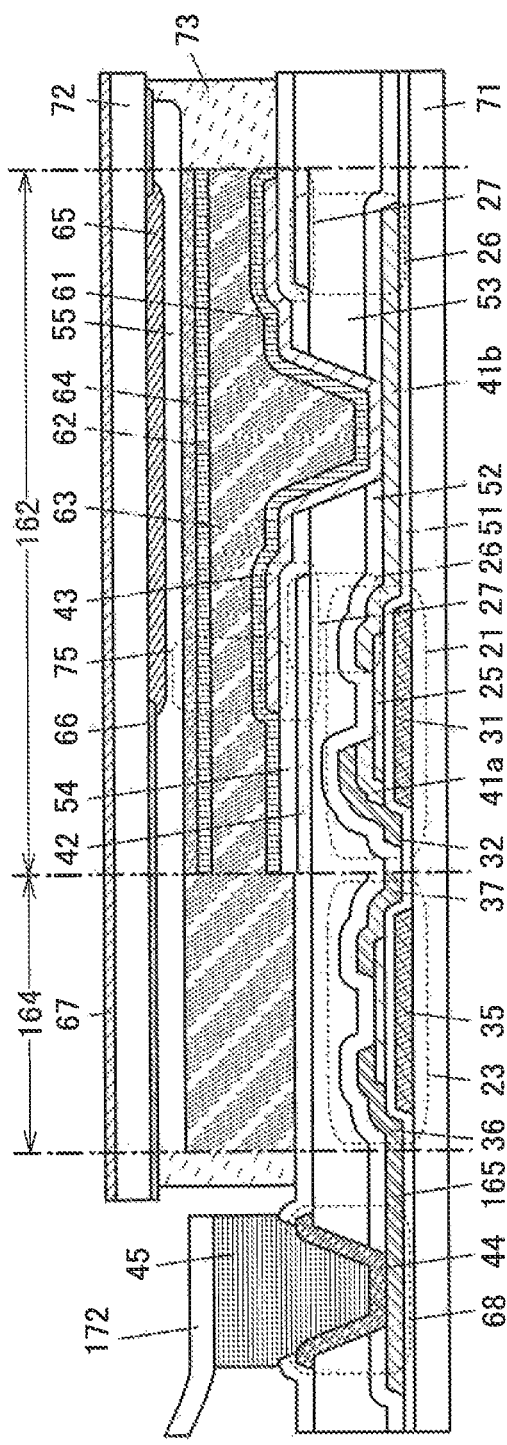
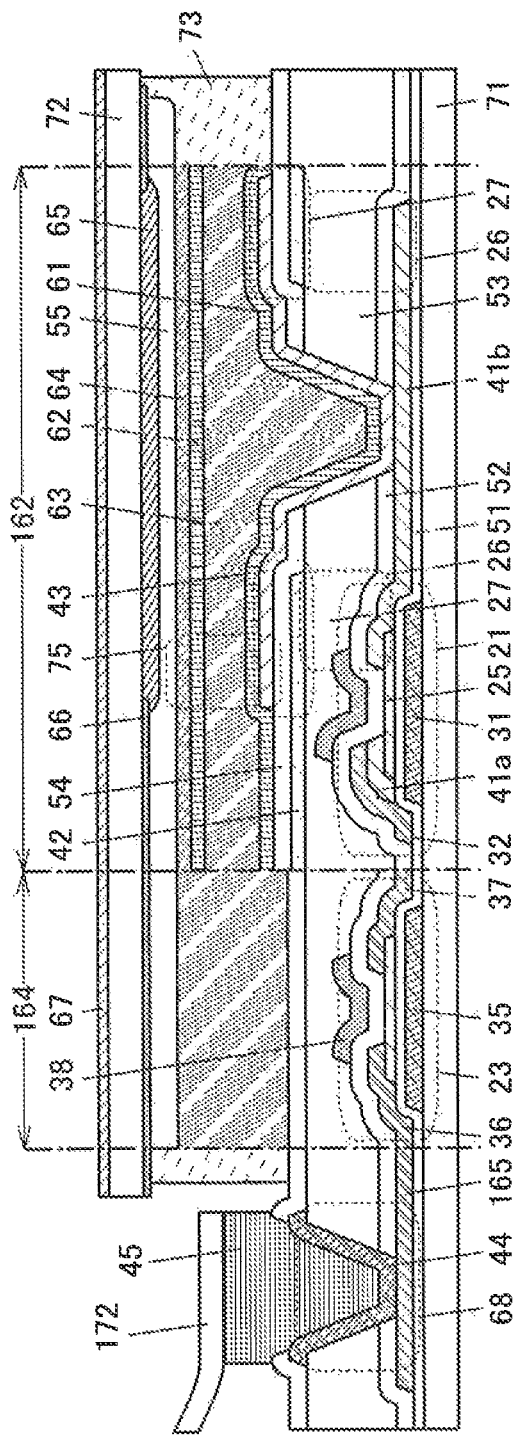
FIG. 15A
FIG. 15B

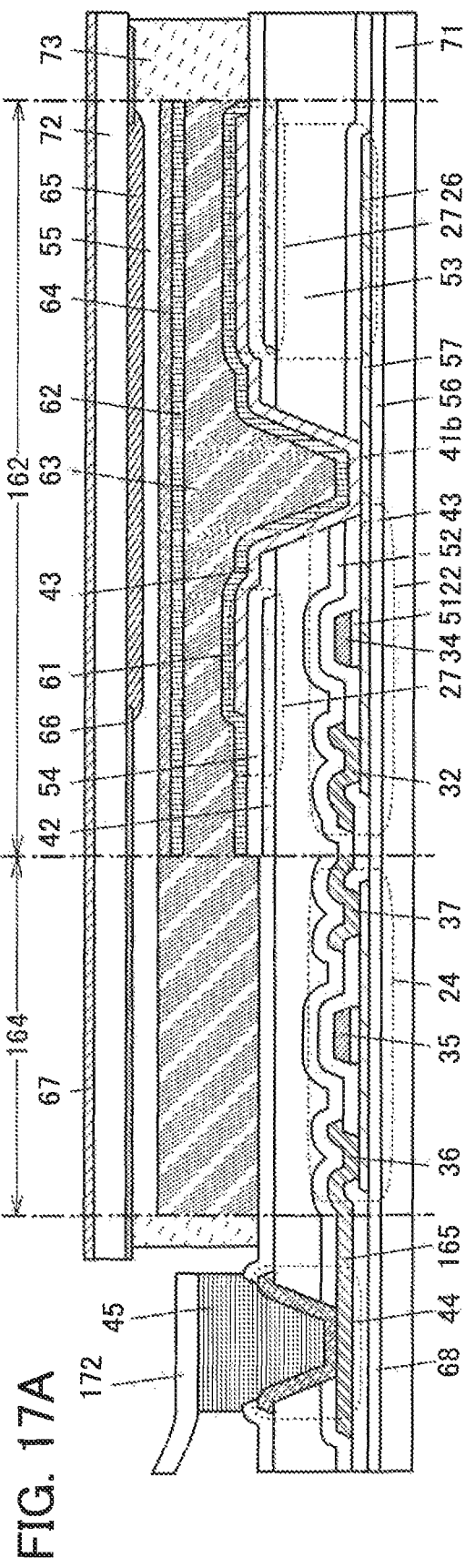
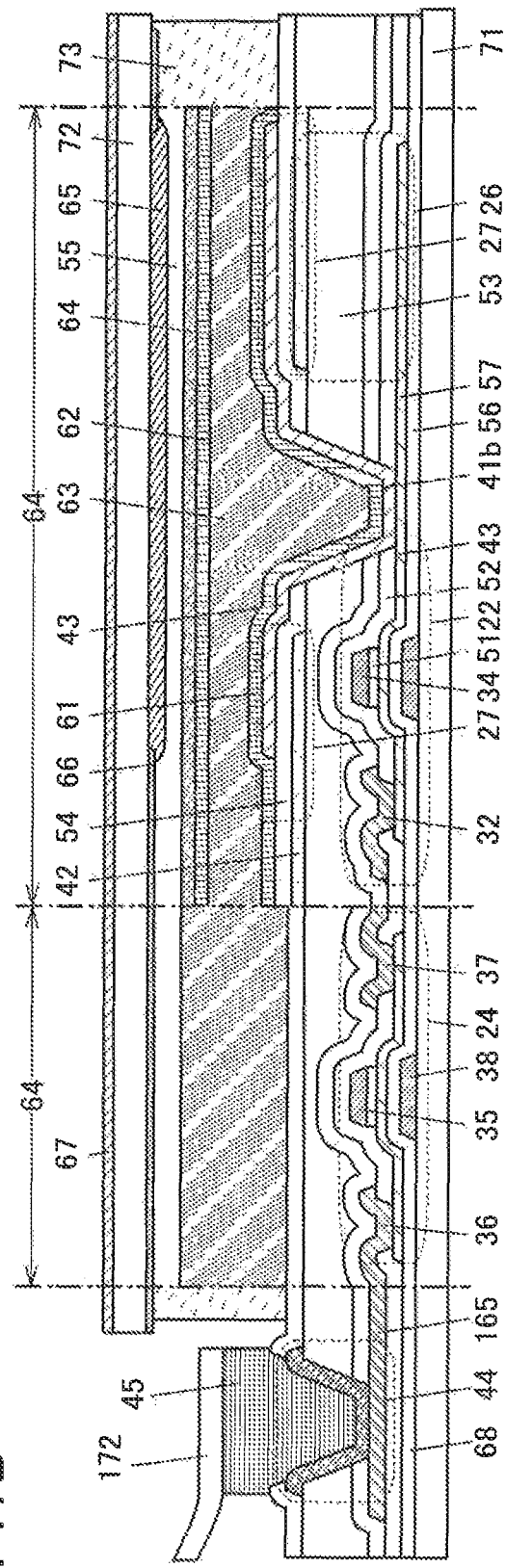
FIG. 17A
FIG. 17B

DISPLAY DEVICE AND ELECTRONIC DEVICE

CROSS-REFERENCE TO RELATED APPLICATIONS

This application is a continuation of U.S. application Ser. No. 15/818,869, filed Nov. 21, 2017, now pending, which claims the benefit of a foreign priority application filed in Japan as Serial No. 2016-227337 on Nov. 23, 2016, both of which are incorporated by reference.

BACKGROUND OF THE INVENTION

1. Field of the Invention

One embodiment of the present invention relates to a liquid crystal display device and an electronic device.

Note that one embodiment of the present invention is not limited to the above technical field. Examples of the technical field of one embodiment of the present invention include a semiconductor device, a display device, a light-emitting device, a power storage device, a storage device, an electronic device, a lighting device, an input device (e.g., a touch sensor), an input/output device (e.g., a touch panel), a method for driving any of them, and a method for manufacturing any of them.

2. Description of the Related Art

In recent years, attention has been drawn to a technique in which, instead of a silicon semiconductor, a metal oxide exhibiting semiconductor characteristics is used for transistors. For example, Patent Documents 1 and 2 disclose techniques in which a transistor is manufactured using zinc oxide or an In—Ga—Zn-based oxide as a metal oxide and the transistor is used as a switching element or the like of a pixel of a display device.

REFERENCES

Patent Documents

Patent Document 1: Japanese Published Patent Application No. 2007-123861
Patent Document 2: Japanese Published Patent Application No. 2007-096055

SUMMARY OF THE INVENTION

A display device that includes a liquid crystal element or a light-emitting element can display a high-resolution image when the number of pixels per unit area is increased. In the case of an active display element, a pixel needs to include a display element, a transistor, a capacitor, a wiring, and the like.

When the number of pixels per unit area is increased, area occupied by components that do not transmit light is relatively large in the pixel. That is, aperture ratio is decreased.

Thus, in a transmissive liquid crystal element or the like, the light intensity of a backlight needs to be increased to display a clear image, and power consumption is increased.

In addition, when pixel area is significantly decreased, it becomes difficult to design a horizontal electric field-mode liquid crystal element where a comb-shape electrode is positioned in a horizontal direction. Thus, it also becomes difficult to increase a manufacturing yield.

An object of one embodiment of the present invention is to provide a liquid crystal display device with high aperture ratio. Another object of one embodiment of the present invention is to provide a low-power liquid crystal display device. Another object of one embodiment of the present invention is to provide a high-resolution liquid crystal display device. Another object of one embodiment of the present invention is to provide a highly reliable liquid crystal display device.

The description of these objects does not disturb the existence of other objects. One embodiment of the present invention does not necessarily achieve all the objects. Other objects can be derived from the description of the specification, the drawings, and the claims.

One embodiment of the present invention relates to a liquid crystal display device that includes a capacitor transmitting visible light.

One embodiment of the present invention is a display device that includes a first conductive layer, a second conductive layer, and a liquid crystal element. The first conductive layer is a region where a source electrode or a drain electrode of a transistor extends. The liquid crystal element includes a third conductive layer, a liquid crystal layer, and a fourth conductive layer. The liquid crystal layer is positioned between the third conductive layer and the fourth conductive layer. The first to fourth conductive layers transmit visible light. The first to fourth conductive layers include a region where the first to fourth conductive layers overlap with each other. The second conductive layer is positioned between the first conductive layer and the third conductive layer. A first insulating layer is positioned between the first conductive layer and the second conductive layer. A second insulating layer is positioned between the second conductive layer and the third conductive layer. The second conductive layer includes a first opening portion. The first insulating layer and the second insulating layer include a second opening portion. The second opening portion is positioned inside the first opening portion. The third conductive layer is electrically connected to the first conductive layer through the second opening portion.

Another embodiment of the present invention is a display device that includes a first conductive layer, a second conductive layer, and a liquid crystal element. The first conductive layer is a region where a semiconductor layer of a transistor extends. The liquid crystal element includes a third conductive layer, a liquid crystal layer, and a fourth conductive layer. The liquid crystal layer is positioned between the third conductive layer and the fourth conductive layer. The first to fourth conductive layers transmit visible light. The first to fourth conductive layers include a region where the first to fourth conductive layers overlap with each other. The second conductive layer is positioned between the first conductive layer and the third conductive layer. A first insulating layer is positioned between the first conductive layer and the second conductive layer. A second insulating layer is positioned between the second conductive layer and the third conductive layer. The second conductive layer includes a first opening portion. The first insulating layer and the second insulating layer include a second opening portion. The second opening portion is positioned inside the first opening portion. The third conductive layer is electrically connected to the first conductive layer through the second opening portion.

The second conductive layer is a common electrode. The first conductive layer, the second conductive layer, and the first insulating layer can function as a first capacitor. The second conductive layer, the third conductive layer, and the second insulating layer can function as a second capacitor.

The first to fourth conductive layers can each include a metal oxide.

The transistor includes a fifth conductive layer functioning as a gate electrode. The fifth conductive layer may include a metal oxide that transmits visible light.

The fifth conductive layer may include a region overlapping with the first to fourth conductive layers.

The transistor preferably includes a metal oxide in a semiconductor layer where a channel is formed.

Note that in this specification, in some cases, the display device includes any of the following modules in its category: a module in which a connector such as a flexible printed circuit (FPC) or a tape carrier package (TCP) is attached to a display portion; a module in which a printed wiring board is provided on the tip of a TCP; and a module having an integrated circuit (IC) directly mounted by chip on glass (COG) on a substrate over which a display element is formed.

One embodiment of the present invention can provide a liquid crystal display device with high aperture ratio. One embodiment of the present invention can provide a low-power liquid crystal display device. One embodiment of the present invention can provide a high-resolution liquid crystal display device. One embodiment of the present invention can provide a highly reliable liquid crystal display device.

Note that the description of these effects does not disturb the existence of other effects. One embodiment of the present invention does not necessarily achieve all the effects. Other effects can be derived from the description of the specification, the drawings, and the claims.

BRIEF DESCRIPTION OF THE DRAWINGS

In the accompanying drawings:

FIGS. 15A and 15B are cross-sectional views illustrating the display device;

FIGS. 17A and 17B are cross-sectional views illustrating the display device;

DETAILED DESCRIPTION OF THE INVENTION

Figure 1:
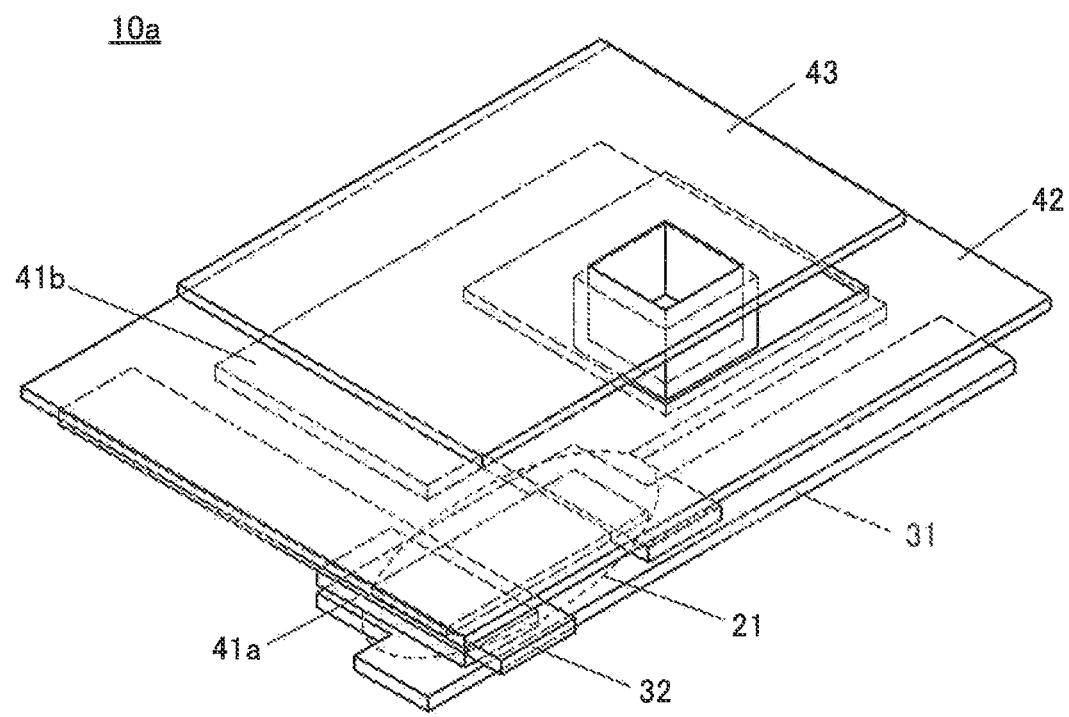
FIG. 1 is a perspective view illustrating a pixel.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

In structures of the invention described below, the same portions or portions having similar functions are denoted by the same reference numerals in different drawings, and the description thereof is not repeated. The same hatching pattern is applied to portions having similar functions, and the portions are not particularly denoted by reference numerals in some cases.

The position, size, range, or the like of each component illustrated in the drawings is not accurately represented in some cases for easy understanding. Therefore, the disclosed invention is not necessarily limited to the position, size, range, or the like disclosed in the drawings.

The terms "film" and "layer" can be interchanged with each other depending on circumstances or conditions. For example, the term "conductive layer" can be changed into the term "conductive film." The term "insulating film" can be changed into the term "insulating layer," for example.

In this specification and the like, a metal oxide means an oxide of metal in a broad sense. A metal oxide is classified into an oxide insulator, an oxide conductor (including a transparent oxide conductor), an oxide semiconductor (also simply referred to as an OS), and the like. For example, a metal oxide used for a semiconductor layer of a transistor is called an oxide semiconductor in some cases. That is, an OS transistor is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a display device in one embodiment of the present invention is described.

The display device in one embodiment of the present invention includes a first conductive layer, a second conductive layer, and a liquid crystal element. In the liquid crystal element, a liquid crystal layer is positioned between a third conductive layer and a fourth conductive layer.

The first to fourth conductive layers transmit visible light and include a region where the first to fourth conductive layers overlap with each other. The second conductive layer is positioned between the first conductive layer and the third conductive layer.

An insulating layer is positioned between the first conductive layer and the second conductive layer. An insulating layer is positioned between the second conductive layer and the third conductive layer. Therefore, two capacitors each including the second conductive layer as an electrode are stacked.

The two capacitors transmit light and overlap with the liquid crystal element; thus, aperture ratio can be increased and the power consumption of the display device can be reduced. In addition, the display device can have higher resolution.

Figure 2:
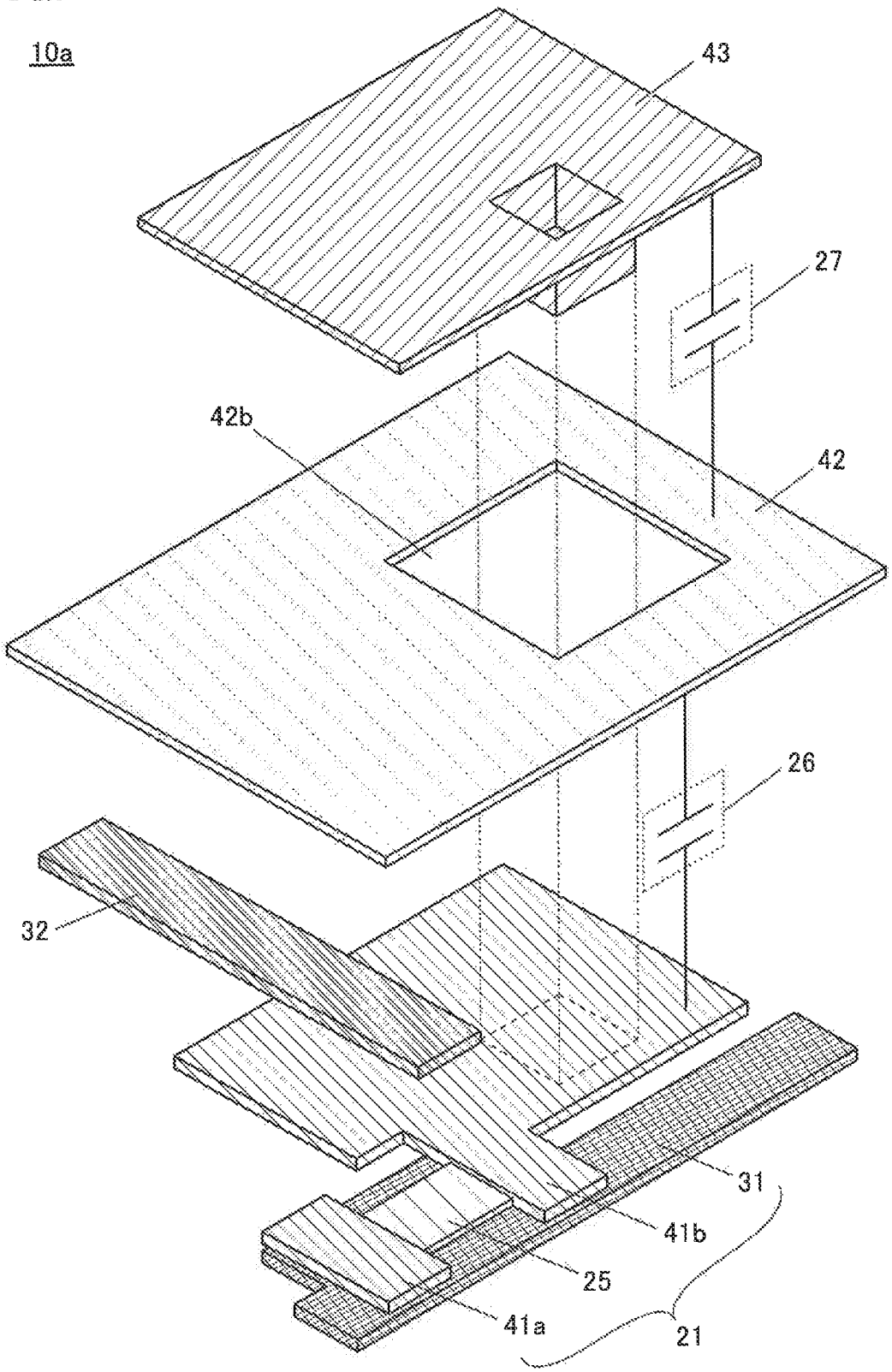
FIG. 2 is a perspective view illustrating the pixel.

FIG. 1 is a perspective view illustrating main components provided in a pixel of a liquid crystal display device in one embodiment of the present invention. FIG. 2 is a development view of the perspective view in a vertical direction. Note that FIG. 1 and FIG. 2 do not illustrate insulating layers and the like for clarity.

A pixel 10a includes a wiring 31, a wiring 32, a transistor 21, a conductive layer 42, and a conductive layer 43.

Here, the wiring 31 functions as a scan line. The wiring 32 functions as a signal line. The wirings 31 and 32 each preferably include a low-resistance metal layer to prevent signal delay.

Part of the wiring 31 and a region where the wiring 31 extends function as a gate of the transistor 21. Characteristics of the transistor 21 might be varied by irradiation with light depending on a material used for a channel region of the transistor 21. The use of a metal layer with a high light-blocking property for the wiring 31 can suppress irradiation of the channel region with light such as external light or light from a backlight. Thus, the reliability of the transistor 21 can be increased.

The transistor 21 is a bottom-gate transistor, which includes a semiconductor layer 25, a conductive layer 41a, and a conductive layer 41b.

The conductive layer 41a functions as one of a source and a drain. The conductive layer 41a is electrically connected to the wiring 32.

The conductive layer 41b functions as the other of the source and the drain. In addition, the conductive layer 41b functions as one electrode or the other electrode of a capacitor.

The conductive layer 42 functions as one electrode or the other electrode of a capacitor. In addition, the conductive layer 42 is a common electrode, which also functions as a capacitor line.

The conductive layer 43 functions as a pixel electrode of a liquid crystal element. In addition, the conductive layer 43 functions as one electrode or the other electrode of a capacitor.

The conductive layer 42 includes an opening portion 42b. In addition, in the opening portion 42b, the conductive layer 41b is electrically connected to the conductive layer 43.

A first insulating layer (not illustrated in FIG. 1 and FIG. 2) is positioned between the conductive layers 41b and 42. Thus, it is possible to form a capacitor 26 that includes the conductive layers 41b and 42 as electrodes and the first insulating layer as a dielectric.

A second insulating layer (not illustrated in FIG. 1 and FIG. 2) is positioned between the conductive layers 42 and 43. Thus, it is possible to form a capacitor 27 that includes the conductive layers 42 and 43 as electrodes and the second insulating layer as a dielectric.

Figure 3A:
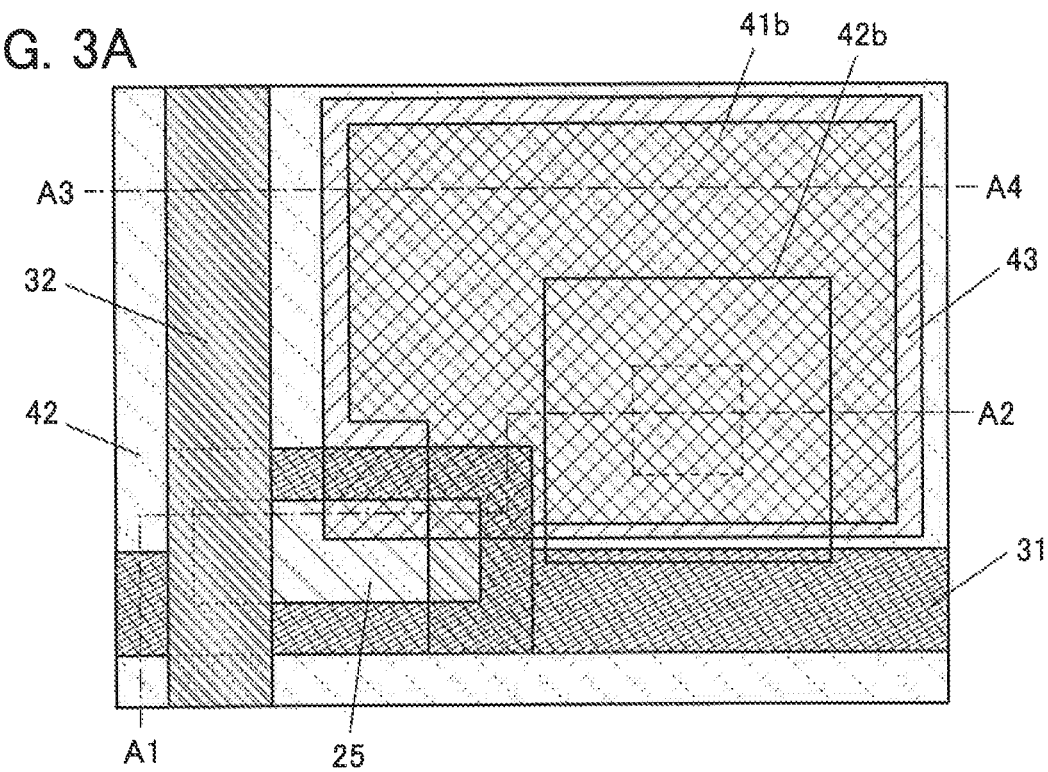
FIGS. 3A to 3C are a top view and cross-sectional views illustrating the pixel.

FIG. 3A is a top view of the pixel 10a. As illustrated in FIG. 3A, the conductive layers 41b, 42, and 43 are positioned to include a region where the conductive layers 41b, 42, and 43 overlap with each other in a region excluding the wirings 31 and 32.

Here, in one embodiment of the present invention, the conductive layers 41b, 42, and 43, the first insulating layer, and the second insulating layer are each formed using a material that transmits visible light. Thus, a region where the conductive layer 43 that also functions as the pixel electrode of the liquid crystal element, the capacitor 26, and the capacitor 27 overlap with each other transmits light. Consequently, the aperture ratio of the pixel 10a can be increased.

Figure 3B:
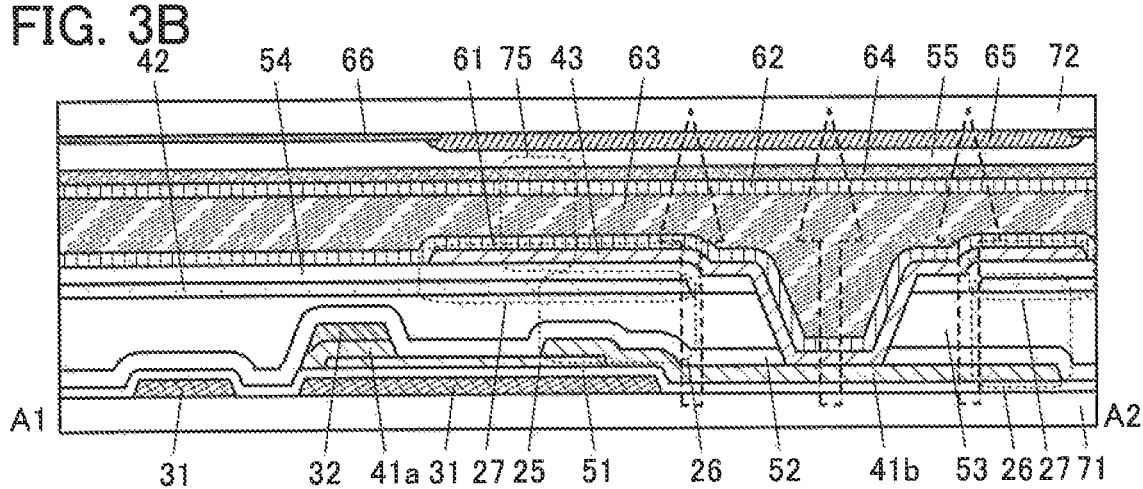
Figure 3C:
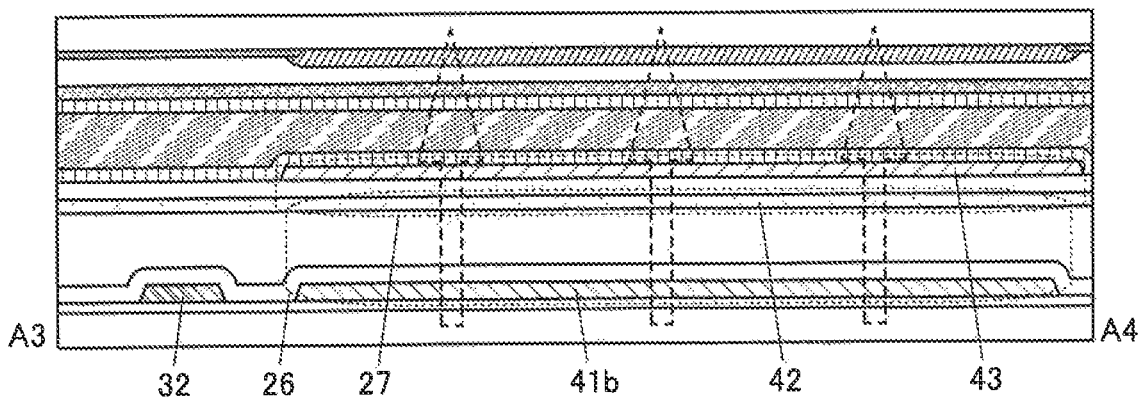

FIG. 3B is a cross-sectional view that corresponds to a cross section taken along a line segment A1-A2 in FIG. 3A. FIG. 3C is a cross-sectional view that corresponds to a cross section taken along a line segment A3-A4 in FIG. 3A. Note that FIGS. 3B and 3C illustrate cross sections of a substrate 71, a substrate 72, a liquid crystal element 75, a coloring layer 65, a light-blocking layer 66, and the like that are not illustrated in FIG. 2.

The liquid crystal element 75 is a transmissive liquid crystal element and operates in a vertical electric field mode. The liquid crystal element 75 can include the conductive layer 43, an alignment film 61, a liquid crystal layer 63, an alignment film 62, and a conductive layer 64.

An insulating layer is positioned between components as needed. An insulating layer 51 positioned between the wiring 31 and the semiconductor layer 25 functions as a gate insulating film of the transistor 21. An insulating layer 52 and an insulating layer 53 provided over the conductive layer 41b function as a protective film and a planarization film, respectively. In addition, an insulating layer 55 that is positioned between the coloring layer 65 and the light-blocking layer 66, and the common electrode functions as a protective film and a planarization film. Note that the insulating layers are just examples, and other insulating layers may be provided. Alternatively, it may be possible not to provide some of the insulating layers.

Here, a region where the conductive layer 41b, the insulating layer 52, the insulating layer 53, and the conductive layer 42 overlap with each other functions as the capacitor 26. A region where the conductive layer 42, an insulating layer 54, and the conductive layer 43 overlap with each other functions as the capacitor 27. In other words, the liquid crystal display device in one embodiment of the present invention includes stacked capacitors where one electrode is used common.

When the number of pixels per unit area is increased, pixel area is inevitably decreased; thus, the capacitance of a capacitor formed in a pixel is decreased. Thus, a reduction of a function of holding an image signal occurs. In one embodiment of the present invention, a region where the capacitors 26 and 27 overlap with each other is provided as a stacked structure; however, the capacitors 26 and 27 are connected to each other in parallel because one electrode is used common. Consequently, the capacitance can be increased compared to the case where one of the capacitors is provided, so that the reduction of the function of holding an image signal can be suppressed.

Furthermore, the capacitor 26 that includes the conductive layers 41b and 42 and the capacitor 27 that includes the conductive layers 42 and 43 transmit visible light.

Thus, when the light from the backlight is delivered from the substrate 71 side, the light is emitted in a direction indicated by dashed arrows. The light from the backlight also penetrates the opening portion 42b.

As illustrated in FIGS. 3B and 3C, the light from the backlight may be emitted to the outside through the coloring layer 65. When the light from the backlight is emitted through the coloring layer 65, the light can be colored with a desired color. The color of the coloring layer 65 can be selected from red (R), green (G), blue (B), cyan (C), magenta (M), yellow (Y), or the like. Note that the light from the backlight may be delivered from the substrate 72 side.

As described above, the use of the structure in one embodiment of the present invention can provide a liquid crystal display device with high aperture ratio. Therefore, a clear image can be displayed without an increase in the intensity of the light from the backlight, and the power consumption of the liquid crystal display device can be reduced.

Figure 4A:
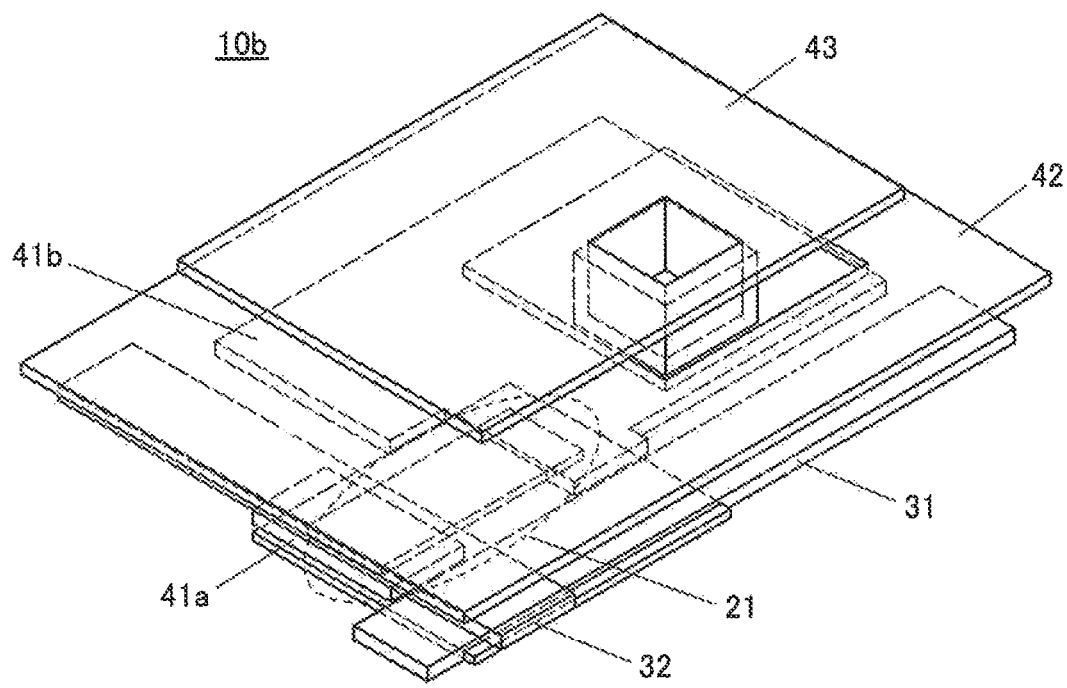
FIGS. 4A and 4B are perspective views illustrating a pixel.

The liquid crystal display device in one embodiment of the present invention may include a pixel 10b illustrated in a perspective view of FIG. 4A.

Figure 4B:
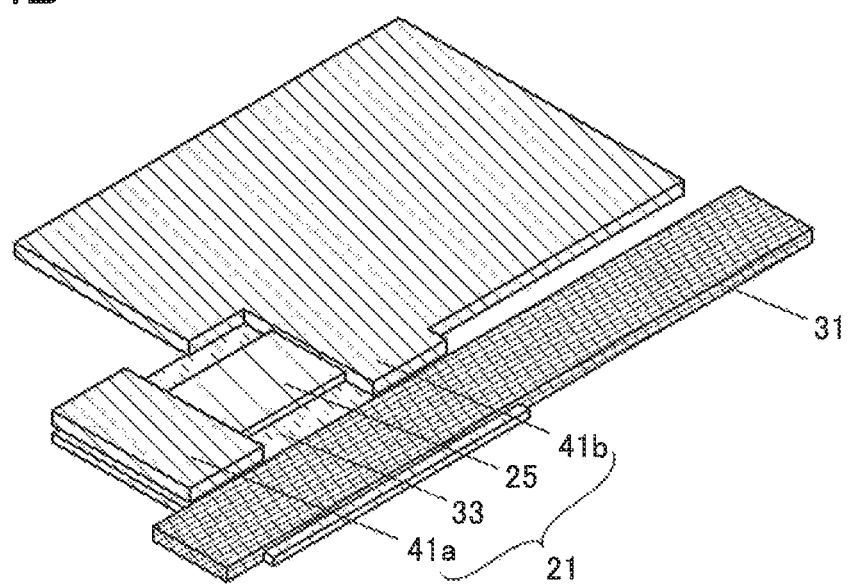

FIG. 4B is a perspective view illustrating the transistor 21 and the wiring 31 in the pixel 10b. The pixel 10b differs from the pixel 10a in the structure of a conductive layer functioning as the gate of the transistor 21.

In the pixel 10a, the region where the wiring 31 extends is used as the gate, whereas in the pixel 10b, a conductive layer 33 that transmits visible light is used as the gate. Therefore, the area of the wiring 31 that blocks light can be reduced.

Figure 5A:
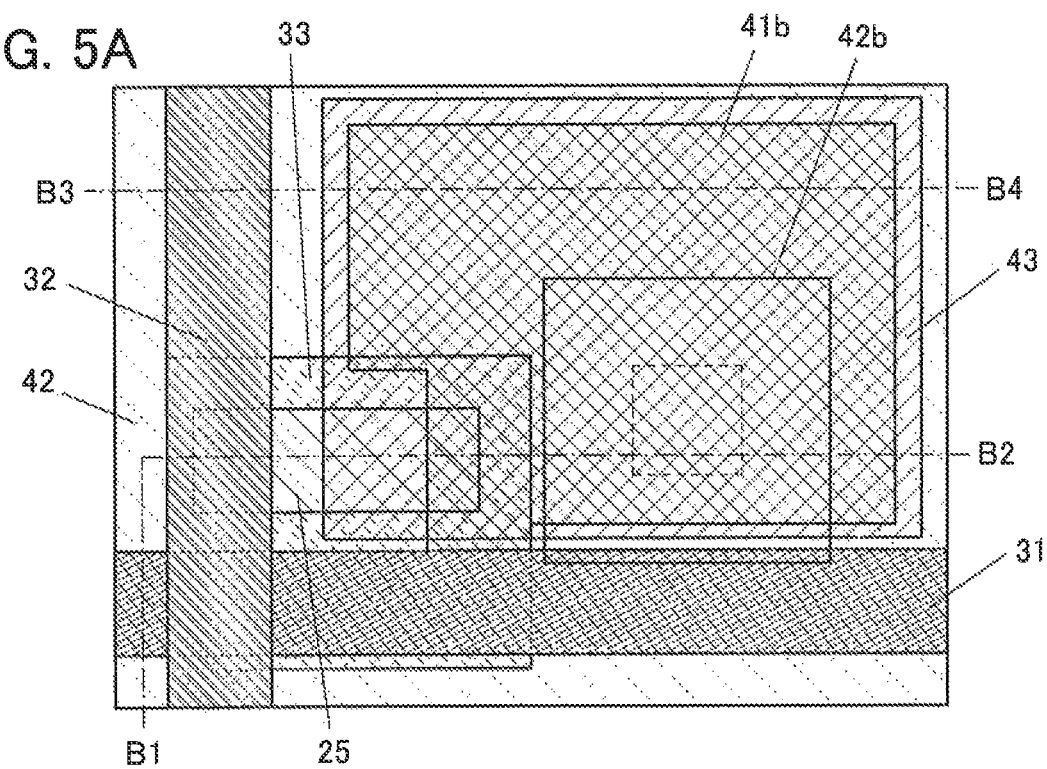
FIGS. 5A to 5C are a top view and cross-sectional views illustrating the pixel.
Figure 5B:
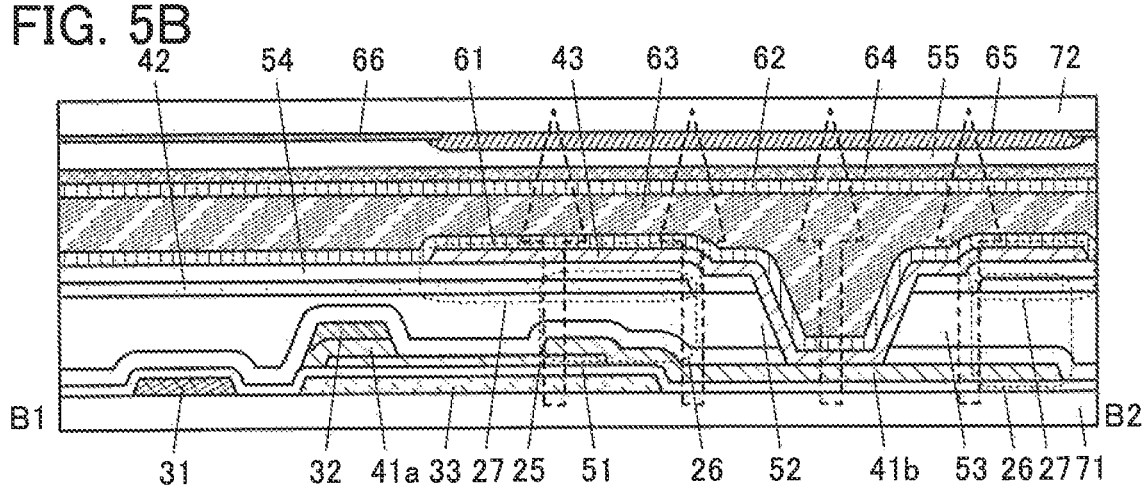
Figure 5C:
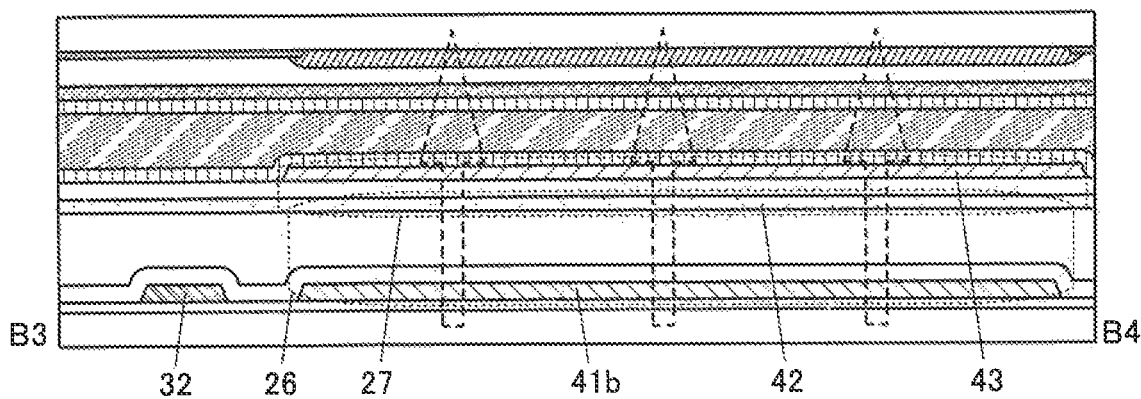

FIG. 5A is a top view of the pixel 10b. FIG. 5B is a cross-sectional view that corresponds to a cross section taken along a line segment B1-B2 in FIG. 5A. FIG. 5C is a cross-sectional view that corresponds to a cross section taken along a line segment B3-B4 in FIG. 5A.

In the pixel 10b, a region where the conductive layer 33 and other components overlap with each other also transmits light in a region excluding the wirings 31 and 32. For example, a contact portion of the semiconductor layer 25 of the transistor 21 and the conductive layer 41b and a channel portion of the transistor 21 can transmit light. Accordingly, the aperture ratio of the pixel 10b can be higher than that of the pixel 10a. Note that the semiconductor layer 25 of the transistor 21 can be formed using a material that transmits visible light, regardless of a pixel structure.

Note that FIGS. 4A and 4B and FIG. 5A illustrate a structure where electrical connection is established by formation of the wiring 31 over the conductive layer 33; however, the conductive layer 33 may be formed over the wiring 31.

Figure 6:
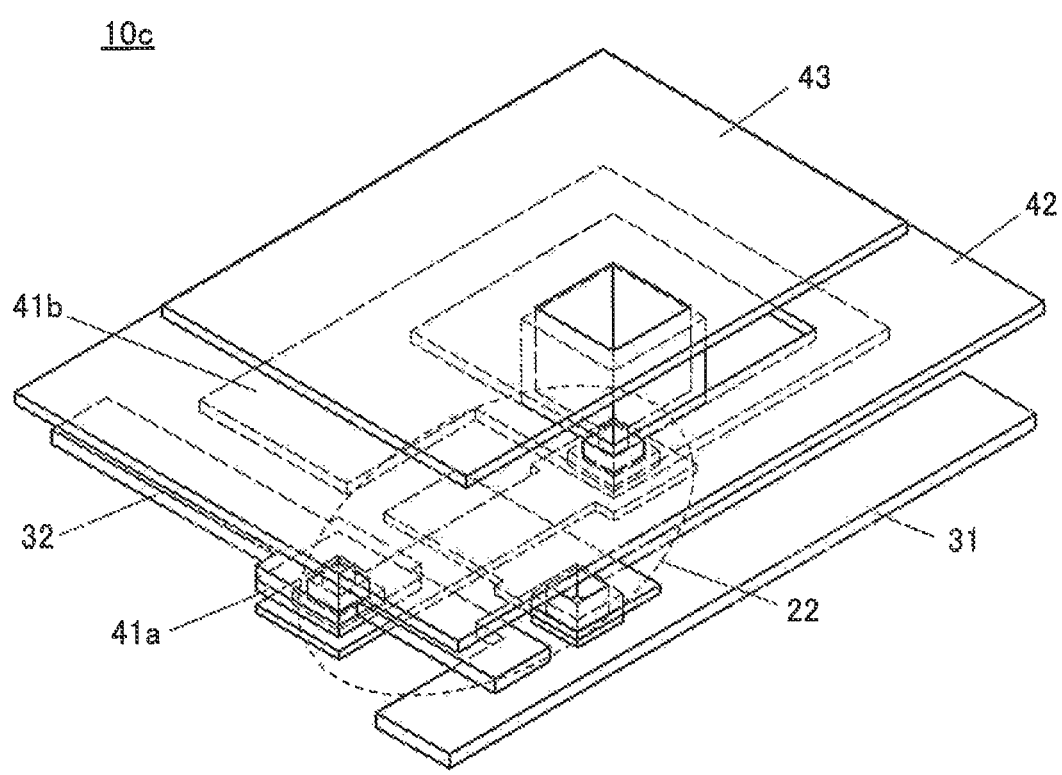
FIG. 6 is a perspective view illustrating a pixel.
Figure 7:
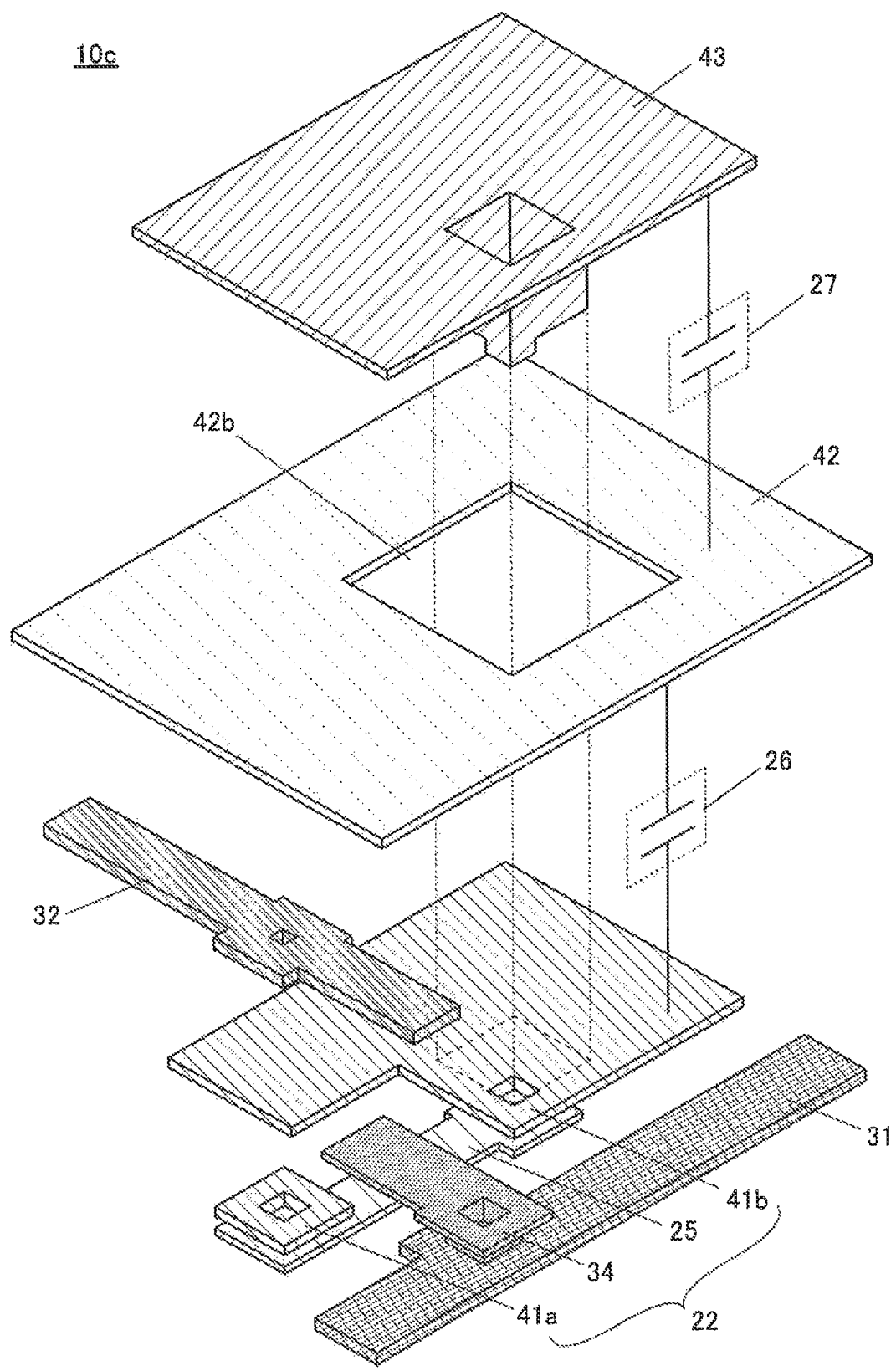
FIG. 7 is a perspective view illustrating the pixel.

Furthermore, the liquid crystal display device in one embodiment of the present invention may include a pixel 10c illustrated in perspective views of FIG. 6 and FIG. 7. The pixel 10c has a structure similar to those of the pixels 10a and 10b except for a transistor structure.

The pixel 10c includes a self-aligned top-gate transistor. A transistor 22 includes the semiconductor layer 25, the conductive layer 41a, the conductive layer 41b, and a conductive layer 34.

The conductive layer 41a functions as one of a source and a drain. The conductive layer 41b functions as the other of the source and the drain. In addition, the conductive layer 41b functions as one electrode or the other electrode of a capacitor. The conductive layer 34 functions as a gate.

Figure 8A:
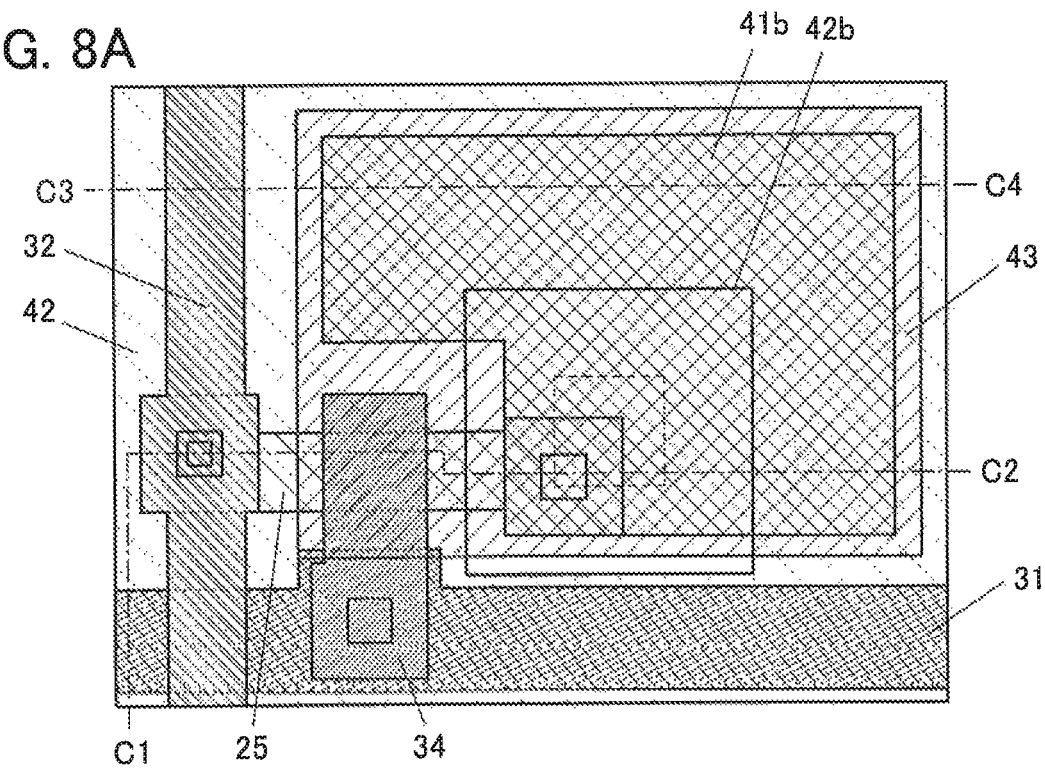
FIGS. 8A to 8C are a top view and cross-sectional views illustrating the pixel.
Figure 8B:
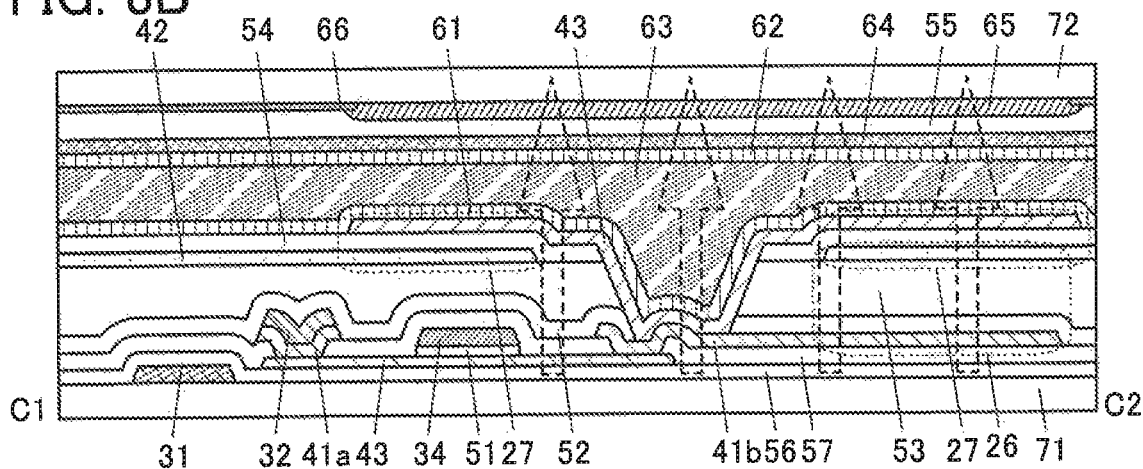
Figure 8C:
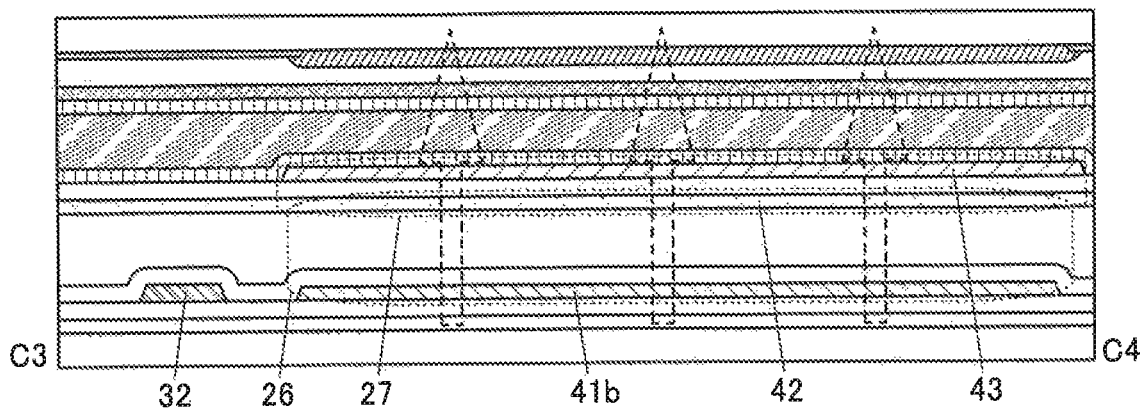

FIG. 8A is a top view of the pixel 10c. FIG. 8B is a cross-sectional view that corresponds to a cross section taken along a line segment C1-C2 in FIG. 8A. FIG. 8C is a cross-sectional view that corresponds to a cross section taken along a line segment C3-C4 in FIG. 8A.

Figure 12A:
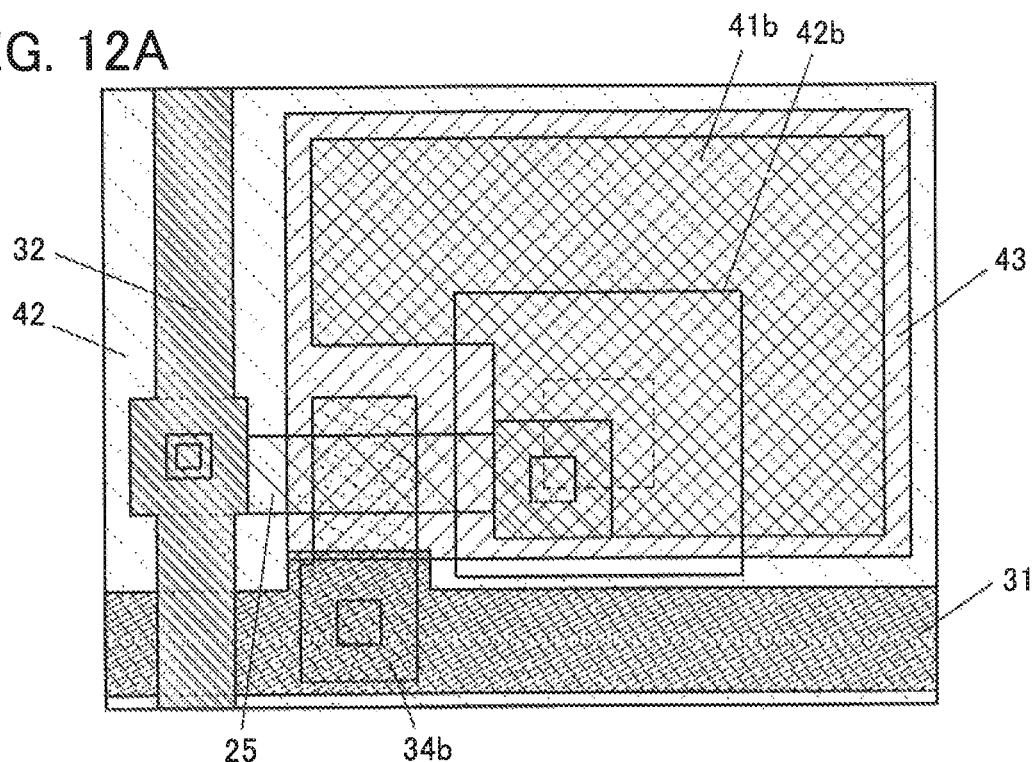
FIGS. 12A and 12B are top views illustrating the pixels.

In the pixel 10c, a region where the semiconductor layer 25 and other components overlap with each other also transmits light in a region excluding the wirings 31 and 32 and the conductive layer 34. Accordingly, the aperture ratio can be increased. Note that although the conductive layer 34 can be formed using a low-resistance material such as metal, the conductive layer 34 may be replaced with the conductive layer 34b that transmits visible light, as illustrated in FIG. 12A. This structure can further increase the aperture ratio.

Note that as illustrated in FIG. 8B, in the case of a top-gate transistor, it is preferable to provide an insulating layer 56 between the substrate 71 and the semiconductor layer 25. The shielding effect of the insulating layer 56 can prevent diffusion of an impurity from the substrate 71 to the semiconductor layer 25. In addition, when an oxide semiconductor is used for the semiconductor layer 25, excess oxygen in the insulating layer 56 and a protective film 57 can fill oxygen vacancies in the semiconductor layer 25, so that the reliability of the transistor can be increased.

Figure 9:
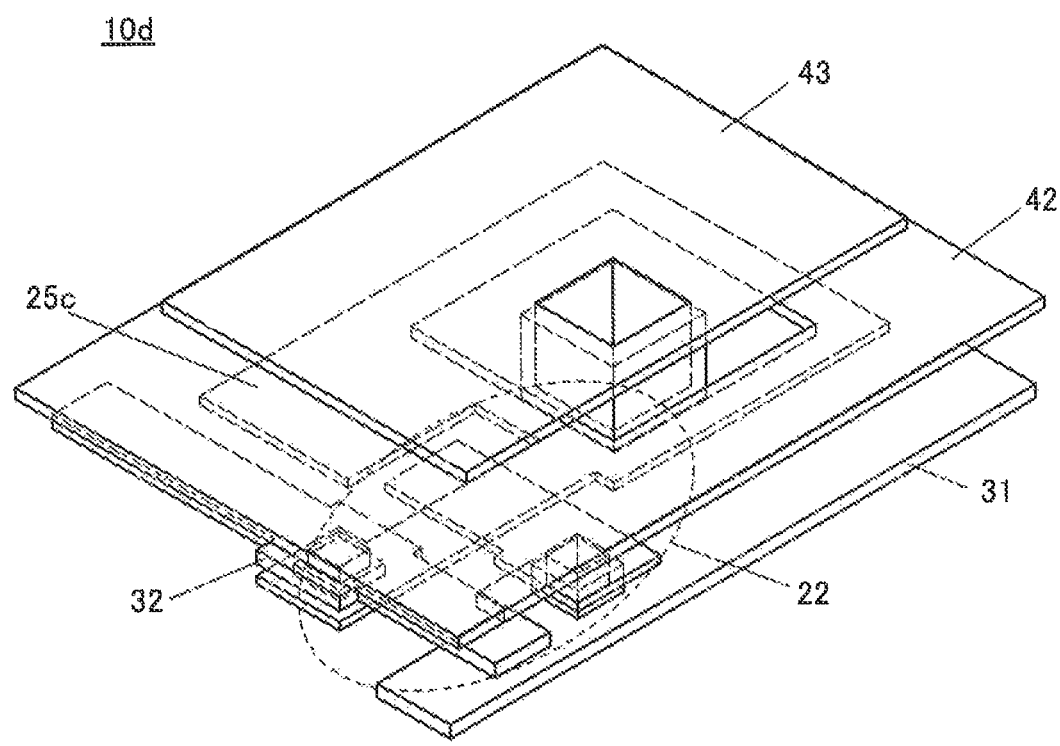
FIG. 9 is a perspective view illustrating a pixel.
Figure 10:
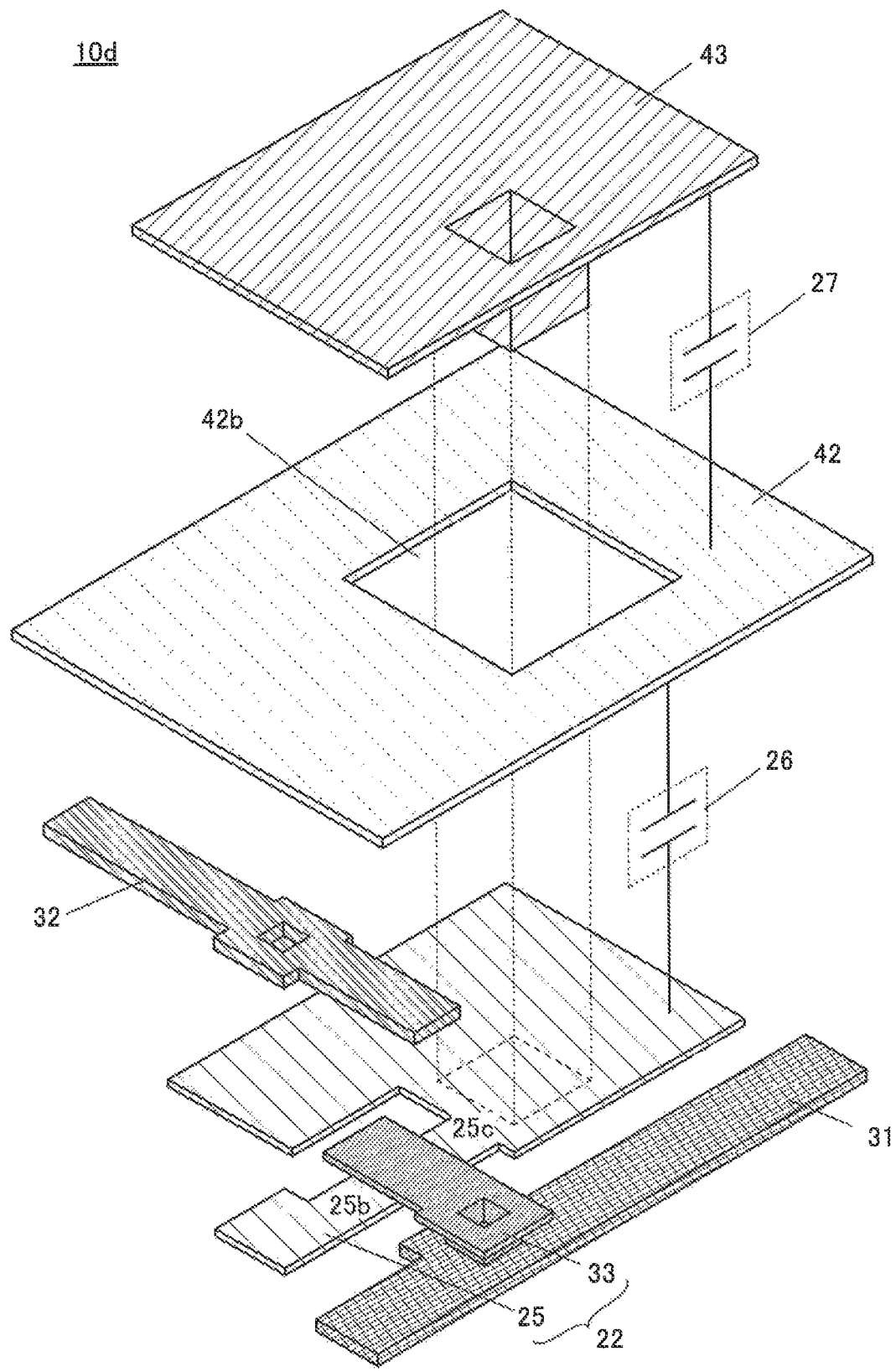
FIG. 10 is a perspective view illustrating the pixel.

Furthermore, the liquid crystal display device in one embodiment of the present invention may include a pixel 10d in FIG. 9 and FIG. 10. The pixel 10d has a structure similar to that of the pixel 10c except that the semiconductor layer 25 has a different shape and that the conductive layers 41a and 41b are not included.

In the transistor 22, the semiconductor layer 25 includes a region 25b that functions as one of a source and a drain and a region 25c that functions as the other of the source and the drain.

In the transistor 22 included in the pixel 10c, the conductive layer 41a that functions as one of the source and the drain is connected to the region 25b. In contrast, in the transistor 22 included in the pixel 10d, the region 25b is directly connected to the wiring 32.

Furthermore, in the transistor 22 included in the pixel 10c, the conductive layer 41b that functions as the other of the source and the drain is connected to the region 25c, and the conductive layer 41b functions as the electrode of the capacitor 26. In contrast, in the transistor 22 included in the pixel 10d, the region 25c extends to function as the electrode of the capacitor 26.

As a result, steps and the like for forming the conductive layers 41a and 41b can be omitted, so that manufacturing cost can be reduced.

Figure 11A:
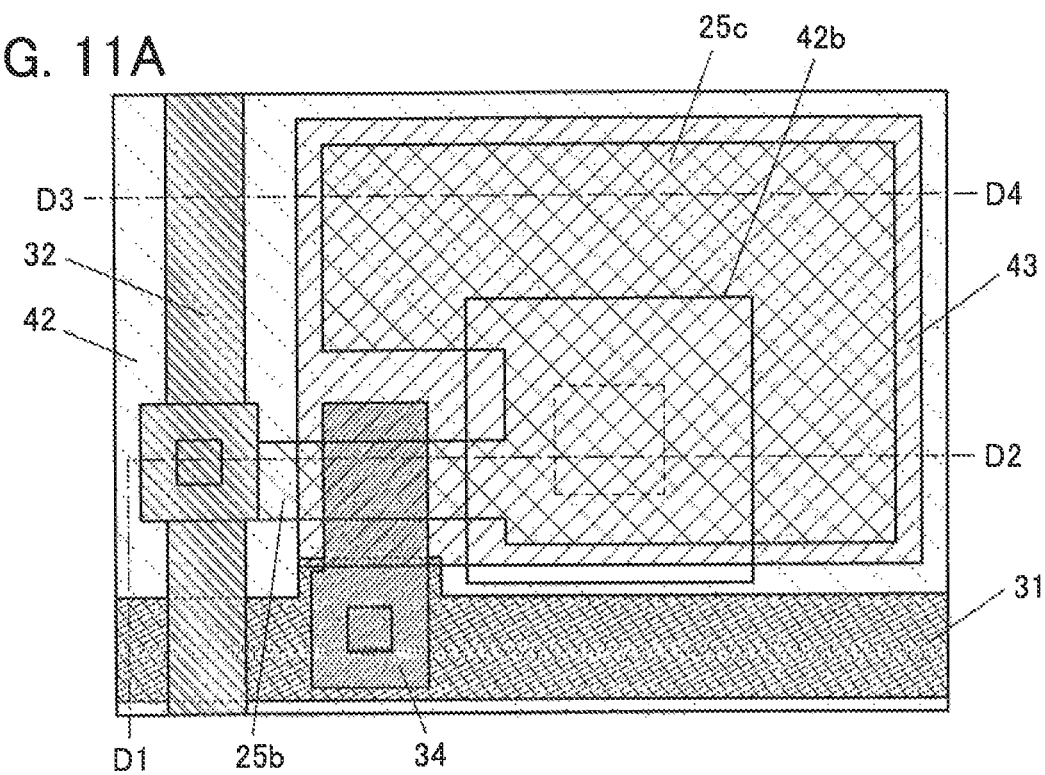
FIGS. 11A to 11C are a top view and cross-sectional views illustrating the pixel.
Figure 11B:
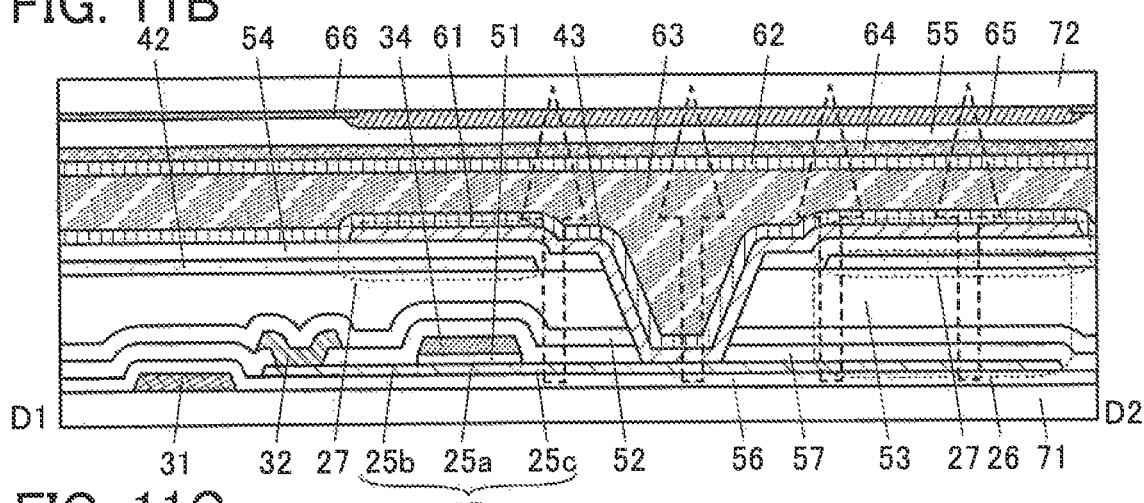
Figure 11C:
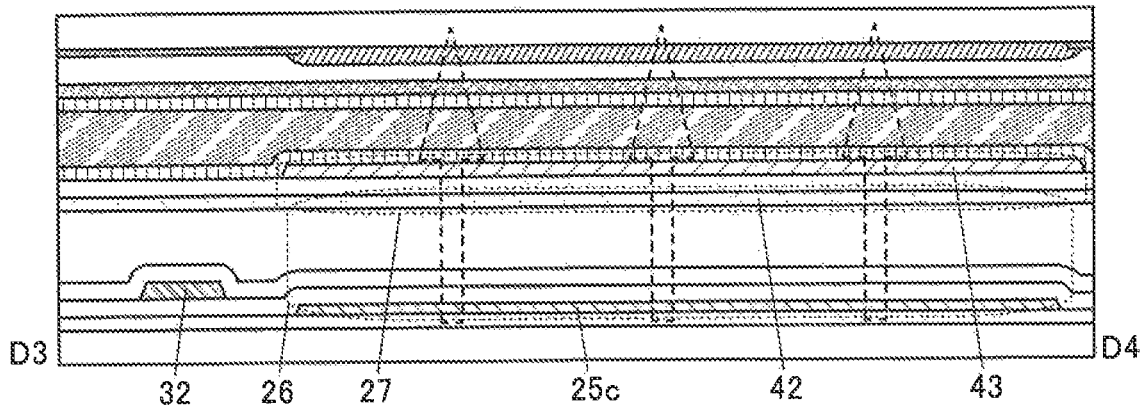

FIG. 11A is a top view of the pixel 10d. FIG. 11B is a cross-sectional view that corresponds to a cross section taken along a line segment D1-D2 in FIG. 11A. FIG. 11C is a cross-sectional view that corresponds to a cross section taken along a line segment D3-D4 in FIG. 11A.

Figure 12B:
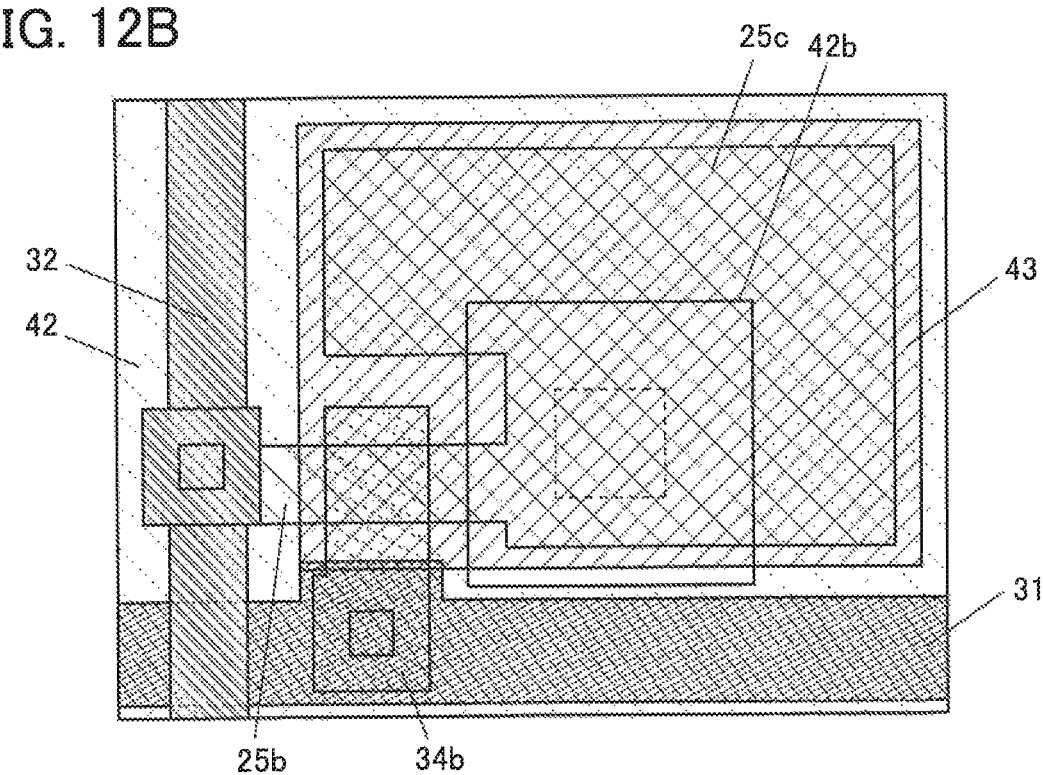

As in the pixel 10c, in the pixel 10d, a region where the semiconductor layer 25 and other components overlap with each other also transmits light in a region excluding the wirings 31 and 32 and the conductive layer 34. Accordingly, the aperture ratio can be increased. Note that the conductive layer 34 may be replaced with the conductive layer 34b that transmits visible light, as illustrated in FIG. 12B. This structure can further increase the aperture ratio.

Since the pixel 10d does not include the conductive layer 41b, the pixel 10d has higher transmittance in an opening portion than the pixel 10c.

As illustrated in FIG. 11B, the semiconductor layer 25 includes a region 25a that functions as a channel formation region, the region 25b that functions as one of the source and the drain, and the region 25c that functions as the other of the source and the drain. The regions 25b and 25c are low-resistance regions that can be formed by formation of oxygen vacancies with introduction of impurities into the semiconductor layer 25 by plasma treatment, doping treatment, or the like using the conductive layer 34 as a mask.

Materials described below can be used for the transistors, wirings, capacitors, and the like. Note that these materials can also be used for semiconductor layers and conductive layers that transmit visible light in other structure examples described in this embodiment.

The semiconductor layer of the transistor can be formed using a light-transmitting semiconductor material. Examples of the light-transmitting semiconductor material include a metal oxide and an oxide semiconductor. The oxide semiconductor preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, or the like may be contained.

The conductive layer of the transistor can be formed using a light-transmitting conductive material. The light-transmitting conductive material preferably contains one or more elements selected from indium, zinc, or tin. Specific examples of the light-transmitting conductive material include an In oxide, an In—Sn oxide (also referred to as indium tin oxide or ITO), an In—Zn oxide, an In—W oxide, an In—W—Zn oxide, an In—Ti oxide, an In—Sn—Ti oxide, an In—Sn—Si oxide, a Zn oxide, and a Ga—Zn oxide.

The conductive layer of the transistor may be formed using an oxide semiconductor that includes an impurity element and has reduced resistance. The oxide semiconductor with the reduced resistance can be regarded as an oxide conductor (OC).

For example, to form an oxide conductor, oxygen vacancies are formed in an oxide semiconductor and then hydrogen is added to the oxygen vacancies, so that a donor level is formed in the vicinity of the conduction band. The oxide semiconductor having the donor level has increased conductivity and becomes a conductor.

An oxide semiconductor has a large energy gap (e.g., an energy gap of larger than or equal to 2.5 eV) and thus transmits visible light. As described above, an oxide conductor is an oxide semiconductor having a donor level in the vicinity of the conduction band. Therefore, the influence of absorption due to the donor level is small in an oxide conductor, and the oxide conductor has a light-transmitting property comparable to that of an oxide semiconductor.

The oxide conductor preferably contains one or more metal elements contained in the semiconductor layer of the transistor. When two or more layers included in the transistor are formed using oxide semiconductors containing the same metal element, the same manufacturing apparatus (e.g., deposition apparatus or processing apparatus) can be used in two or more steps and manufacturing cost can thus be reduced.

The structure of the pixel included in the liquid crystal display device described in this embodiment enables efficient use of light emitted from a backlight unit. Thus, an excellent liquid crystal display device with lower power consumption can be provided.

Figure 13:
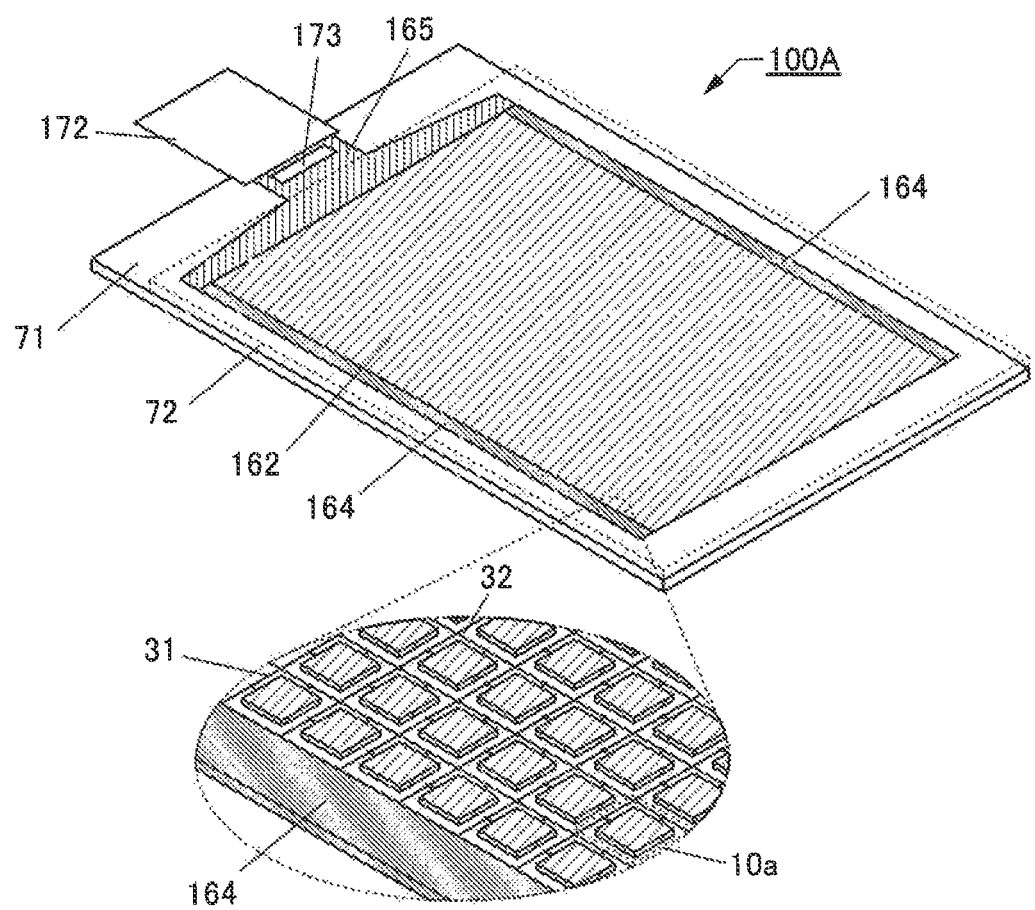
FIG. 13 is a perspective view illustrating a display device.

Next, the liquid crystal display device in this embodiment is described with reference to FIG. 13. FIG. 13 is a perspective view of a display device 100A. Part of the display device 100A is enlarged. Note that for clarity, the substrate 72 is indicated by a dashed line in FIG. 13, and components such as a polarizing plate 67 are not illustrated in FIG. 13.

The display device 100A includes a display portion 162 and a driver circuit portion 164. An FPC 172 and an IC 173 are mounted on the display device 100A.

The display portion 162 includes a plurality of pixels and has a function of displaying images. A pixel includes a plurality of subpixels. Note that although FIG. 13 illustrates the pixel 10a as a subpixel, the subpixel may be the pixel 10b, the pixel 10c, or the pixel 10d.

For example, a subpixel exhibiting red, a subpixel exhibiting green, and a subpixel exhibiting blue can form one pixel, which leads to full-color display in the display portion 162. Note that the color exhibited by subpixels is not limited to red (R), green (G), and blue (B). A pixel may be composed of subpixels that exhibit colors of white (W), yellow (Y), magenta (M), or cyan (C), for example. In this specification and the like, a subpixel is simply described as a pixel in some cases.

The display device 100A may include either or both a scan line driver circuit and a signal line driver circuit. Alternatively, the display device 100A may include neither the scan line driver circuit nor the signal line driver circuit. When the display device 100A includes a sensor such as a touch sensor, the display device 100A may include a sensor driver circuit. In an example described in this embodiment, a scan line driver circuit is included as the driver circuit portion 164. The scan line driver circuit has a function of outputting a scan signal to a scan line included in the display portion 162.

In the display device 100A, the IC 173 is mounted on the substrate 71 by a mounting method such as COG. The IC 173 includes, for example, one or more of a signal line driver circuit, a scan line driver circuit, and a sensor driver circuit.

The FPC 172 is electrically connected to the display device 100A. Through the FPC 172, signals and power are supplied from the outside to the IC 173 and the driver circuit portion 164. In addition, a signal from the IC 173 can be output to the outside through the FPC 172.

An IC may be mounted on the FPC 172. For example, an IC including one or more of a signal line driver circuit, a scan line driver circuit, and a sensor driver circuit may be mounted on the FPC 172.

Signals and power are supplied to the display portion 162 and the driver circuit portion 164 through a wiring 165. The signals and power are input to the wiring 165 from the IC 173 or from the outside through the FPC 172.

Furthermore, an input device 167 can be provided over the substrate 72. The display device 100A with the input device 167 can function as a touch panel.

There is no particular limitation on a sensor element included in the touch panel in one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive type is preferable because multiple points can be sensed simultaneously.

The touch panel in one embodiment of the present invention can have any of a variety of structures, including a structure in which a display device and a sensor element that are separately formed are attached to each other and a structure in which an electrode and the like included in a sensor element are provided on either or both a substrate supporting a display element and a counter substrate.

Figure 14A:
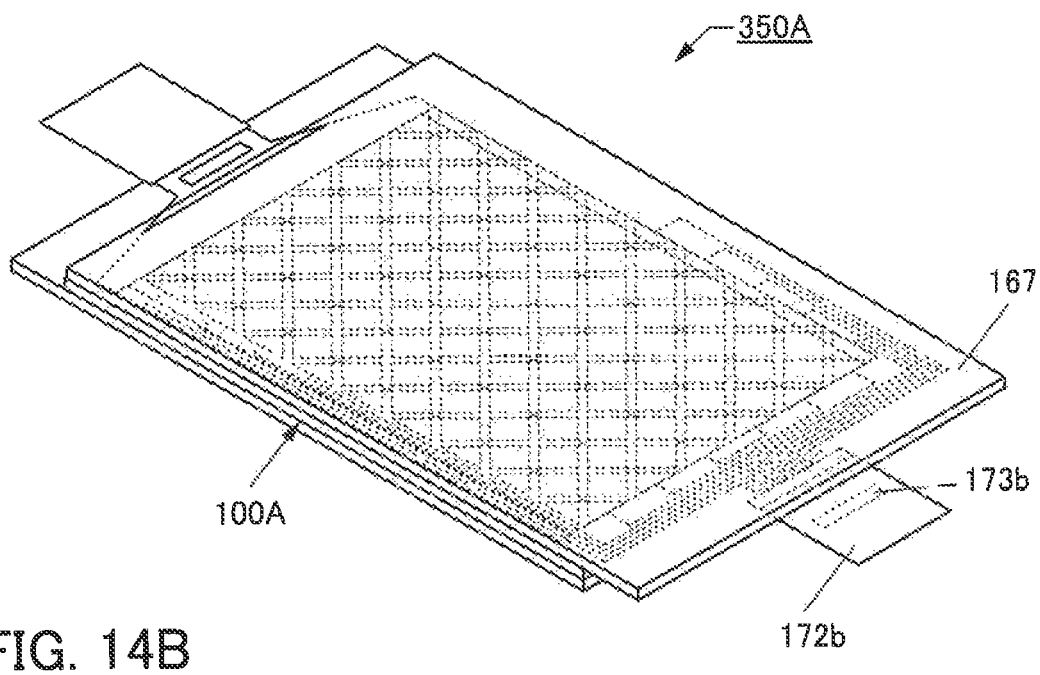
FIGS. 14A and 14B are perspective views illustrating a touch panel and an input device.
Figure 14B:
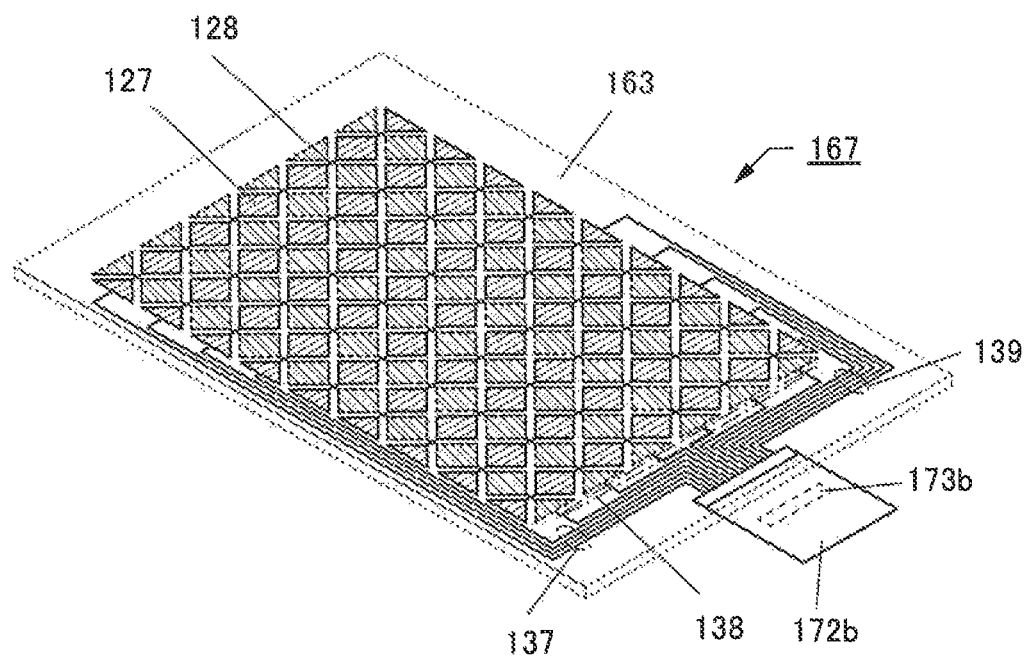

FIGS. 14A and 14B illustrate an example of the touch panel. FIG. 14A is a perspective view of a touch panel 350A. FIG. 14B is a perspective schematic view of the input device 167. Note that FIGS. 14A and 14B illustrate only main components for clarity.

The touch panel 350A has a structure in which a display device and a sensor element that are separately formed are attached to each other.

The touch panel 350A includes the input device 167 and the display device 100A that overlap with each other.

The input device 167 includes a substrate 163, an electrode 127, an electrode 128, a plurality of wirings 137, a plurality of wirings 138, and a plurality of wirings 139. For example, the electrode 127 can be electrically connected to the wiring 137 or 139. In addition, the electrode 128 can be electrically connected to the wiring 139. An FPC 172b is electrically connected to each of the plurality of wirings 137 and the plurality of wirings 138. An IC 173b can be provided on the FPC 172b.

Alternatively, a touch sensor may be positioned between the substrates 71 and 72 in the display device 100A. In the case where a touch sensor is positioned between the substrates 71 and 72, an optical touch sensor including a photoelectric conversion element as well as a capacitive touch sensor may be used.

FIG. 15A is a cross-sectional view illustrating the display portion 162, the driver circuit portion 164, and the wiring 165. Note that although FIG. 15A illustrates an example in which the pixel 10a in FIG. 1, FIG. 2, and FIGS. 3A to 3C is used, a similar structure is obtained when the pixel 10b in FIGS. 4A and 4B and FIGS. 5A to 5C is used.

As illustrated in FIG. 15A, the display device 100A includes the substrate 71, the transistor 21, the transistor 22, the liquid crystal element 75, the alignment film 61, the alignment film 62, a connection portion 68, an adhesive layer 73, the coloring layer 65, the light-blocking layer 66, the insulating layer 55, the substrate 72, a polarizing plate 130, and the like.

The liquid crystal element 75 that is a transmissive liquid crystal element and operates in a vertical electric field mode is provided in the display portion 162. The liquid crystal element 75 includes the conductive layer 43 that functions as a pixel electrode, the conductive layer 64 that functions as a common electrode, and the liquid crystal layer 63. Alignment of the liquid crystal layer 63 can be controlled with an electric field generated between the conductive layers 43 and 64. The liquid crystal layer 63 is positioned between the alignment films 61 and 62.

A liquid crystal material is classified into a positive liquid crystal material with positive dielectric anisotropy ($\Delta\varepsilon$) and a negative liquid crystal material with negative dielectric anisotropy. Both of the materials can be used in one embodiment of the present invention, and an optimal liquid crystal material can be used depending on the mode and design to be used.

The liquid crystal element 75 can employ a variety of modes. For example, a liquid crystal element using a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, a VA-IPS mode, a guest-host mode, or the like can be used.

Furthermore, the display device 100A may include a normally black liquid crystal element, for example, a transmissive liquid crystal element using a VA mode. Examples of the VA mode include a multi-domain vertical alignment (MVA), a patterned vertical alignment (PVA) mode, and an advanced super view (ASV) mode.

The liquid crystal element controls transmission and non-transmission of light by optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the display device 100A is a transmissive liquid crystal display device, a conductive material that transmits visible light is used for both the conductive layers 43 and 64. A conductive material that transmits visible light can be used for one or more conductive layers included in the transistor 21. Thus, at least part of a region where the transistor 21 is provided can be used as an effective display region.

For example, a material containing one or more elements selected from indium (In), zinc (Zn), or tin (Sn) is preferably used for the conductive material that transmits visible light. Specific examples include indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium. Note that a film containing graphene can be used as well. The film containing graphene can be formed, for example, by reducing a film containing graphene oxide.

It is preferable to use an oxide conductive layer that is one embodiment of a metal oxide for one or more of the conductive layer 33, the conductive layer 34, the conductive layer 41a, the conductive layer 41b, the conductive layer 42, the conductive layer 43, and the conductive layer 64 included in the display portion 162. The oxide conductive layer preferably contains one or more metal elements contained in the semiconductor layer 25 of the transistor 21. For example, the oxide conductive layer preferably contains indium and is further preferably an In-M-Zn oxide (M is Al, Ti, Ga, Y, Zr, La, Ce, Nd, Sn, or Hf) film.

It is preferable to use an oxide semiconductor that is one embodiment of a metal oxide for one or more of the conductive layer 33, the conductive layer 34, the conductive layer 41a, the conductive layer 41b, the conductive layer 42, the conductive layer 43, and the conductive layer 64. When two or more layers included in the display device are formed using oxide semiconductors containing the same metal element, the same manufacturing apparatus (e.g., deposition apparatus or processing apparatus) can be used in two or more steps and manufacturing cost can thus be reduced.

The oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide conductive layer can be controlled by selecting treatment for increasing oxygen vacancies and/or impurity concentration in an oxide semiconductor layer or treatment for reducing oxygen vacancies and/or impurity concentration in an oxide semiconductor layer.

Note that such an oxide conductor layer formed using an oxide semiconductor layer can be referred to as an oxide semiconductor layer having high carrier density and low resistivity, an oxide semiconductor layer having conductivity, or an oxide semiconductor layer having high conductivity.

In addition, manufacturing cost can be reduced by forming the oxide semiconductor layer and the oxide conductive layer using the same metal element. For example, manufacturing cost can be reduced by using a metal oxide target with the same metal composition. An etching gas or an etchant used for processing of the oxide semiconductor layer can also be used for processing of the oxide conductive layer. Note that even when the oxide semiconductor layer and the oxide conductive layer have the same metal elements, the metal elements have different compositions in some cases. For example, in some cases, metal elements in the film desorb during the manufacturing process of the display device, which results in different metal compositions.

In the display device 100A, the coloring layer 65 and the light-blocking layer 66 are provided over the liquid crystal layer 63. It is preferable to provide the insulating layer 55 between the coloring layer 65 and the light-blocking layer 66, and the liquid crystal layer 63. The insulating layer 55 can suppress diffusion of impurities contained in the coloring layer 65, the light-blocking layer 66, and the like into the liquid crystal layer 63 and functions as a planarization film.

The substrates 71 and 72 are attached to each other by the adhesive layer 73. The liquid crystal layer 63 is sealed in a region surrounded by the substrates 71 and 72 and the adhesive layer 73.

Note that when the display device 100A functions as a transmissive liquid crystal display device, two polarizing plates are provided so that the display portion 162 is positioned between the two polarizing plates. FIGS. 15A and 15B illustrate the polarizing plate 67 on the substrate 72 side. Light from a backlight provided outside a polarizing plate on the substrate 71 side enters the display portion 162 through the polarizing plate. At this time, the alignment of the liquid crystal layer 63 is controlled with voltage applied between the conductive layers 43 and 64, so that optical modulation of light can be controlled. In other words, the intensity of light emitted through the polarizing plate 67 can be controlled. Furthermore, the coloring layer 65 absorbs light of wavelengths other than a specific wavelength range from incident light, so that red (R), blue (B), or green (G) light is emitted, for example.

A circularly polarizing plate can be used as the polarizing plate, for example. As the circularly polarizing plate, for example, a stack including a linear polarizing plate and a quarter-wave retardation plate can be used. With the circularly polarizing plate, the viewing angle dependence of display of the display device can be reduced.

The liquid crystal element 75 may be driven in a guest-host liquid crystal mode. When the guest-host liquid crystal mode is used, either one or both the polarizing plates are not necessarily required. Since light absorption due to the polarizing plate can be reduced, light extraction efficiency is increased and the display device can perform bright display.

The driver circuit portion 164 includes a transistor 23. The transistor 23 includes a conductive layer 37 that functions as a gate, a gate insulating film, a semiconductor layer, a conductive layer 35, and a conductive layer 36. One of the conductive layers 35 and 36 functions as a source, and the other of the conductive layers 35 and 36 functions as a drain.

The transistor included in the driver circuit portion 164 does not necessarily have a function of transmitting visible light. Therefore, a low-resistance metal layer or the like can be used for the conductive layers 36 and 37.

In the connection portion 68, the wiring 165 is connected to a conductive layer 44, and the conductive layer 44 is connected to a connector 45. That is, in the connection portion 68, the wiring 165 is electrically connected to the FPC 172 through the conductive layer 44 and the connector 45. With this structure, signals and power can be supplied from the FPC 172 to the wiring 165.

The transistors 21 and 22 may have the same structure or different structures. That is, the transistors included in the driver circuit portion 164 and the transistors included in the display portion 162 may have the same structure or different structures. In addition, the driver circuit portion 164 may include transistors having a plurality of structures. The display portion 162 may include transistors having a plurality of structures.

Note that although FIG. 15A illustrates a structure where one gate is provided for a channel formation region of the transistor, two gates formed using the conductive layers 35 and 38 may be provided so that a channel formation region is positioned between the two gates, as in the case of the transistor 23 in FIG. 15B.

Different potentials can be supplied to the conductive layers 35 and 38. Alternatively, the conductive layers 35 and 38 may be electrically connected to each other. The structure in the former case is effective in controlling the threshold voltage of the transistor.

A transistor that includes two gates electrically connected to each other can have higher field-effect mobility and thus have higher on-state current than other transistors. Consequently, a circuit capable of high-speed operation can be obtained. Furthermore, area occupied by a circuit portion can be reduced. The use of the transistor having high on-state current can reduce signal delay in wirings and can suppress display unevenness even in a display device in which the number of wirings is increased because of an increase in size or resolution. In addition, the use of such a structure allows manufacture of a highly reliable transistor.

Note that in the case where the pixel 10b in FIGS. 4A and 4B and FIGS. 5A to 5C includes the conductive layer 38, the conductive layer 38 is preferably formed using a material that transmits visible light.

Figure 16A:
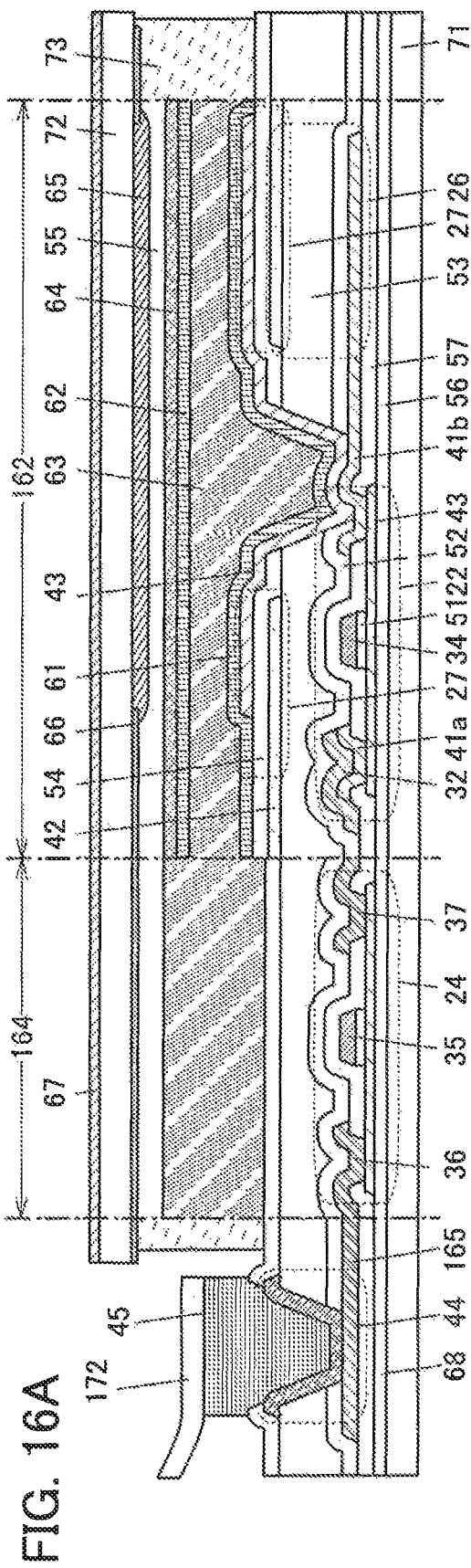
FIGS. 16A and 16B are cross-sectional views illustrating the display device.

FIG. 16A is a cross-sectional view of the display device 100A where the structure of the pixel 10c in FIG. 6, FIG. 7, and FIGS. 8A to 8C is employed. FIG. 17A is a cross-sectional view of the display device 100A where the structure of the pixel 10d in FIG. 9, FIG. 10, and FIGS. 11A to 11C is employed. The driver circuit portion 164 includes a transistor 24.

The transistor included in the driver circuit portion 164 does not necessarily have a function of transmitting visible light. Therefore, a low-resistance metal layer or the like can be used for the conductive layers 36 and 37.

Figure 16B:
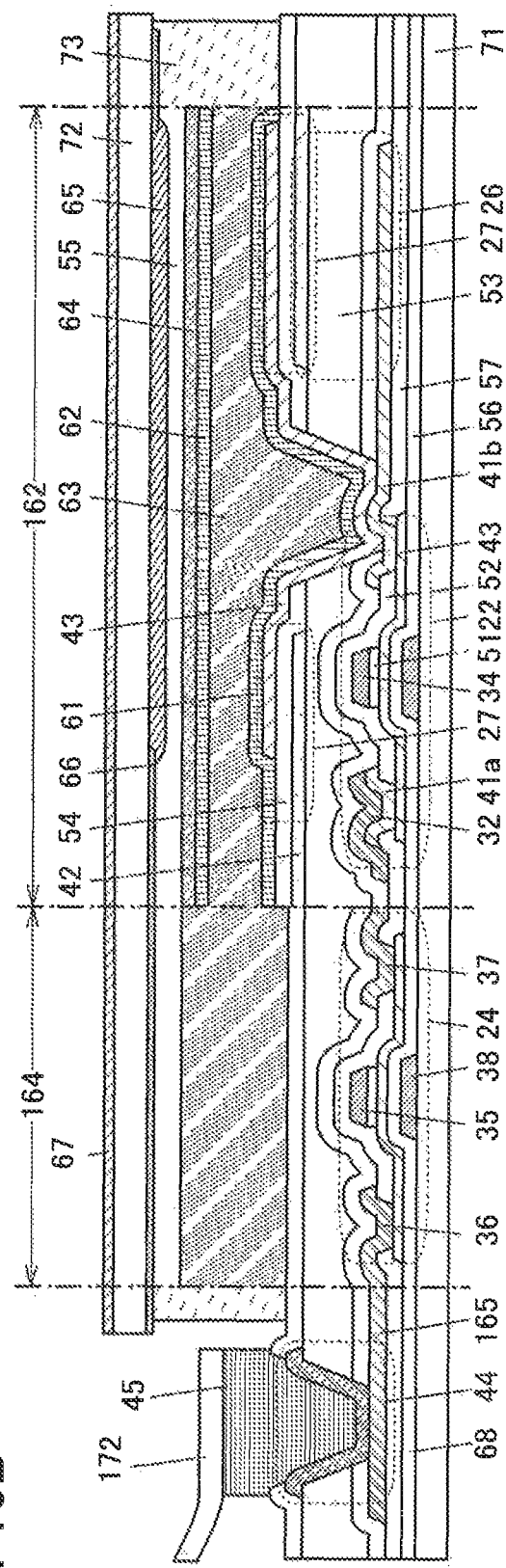

FIG. 16B and FIG. 17B are cross-sectional views where each of the transistors 22 and 24 includes two gate electrodes.

Note that in the case where the pixel 10c in FIG. 12A and the pixel 10d in FIG. 12B each include the conductive layer 38, the conductive layer 38 is preferably formed using a material that transmits visible light.

Figure 18:
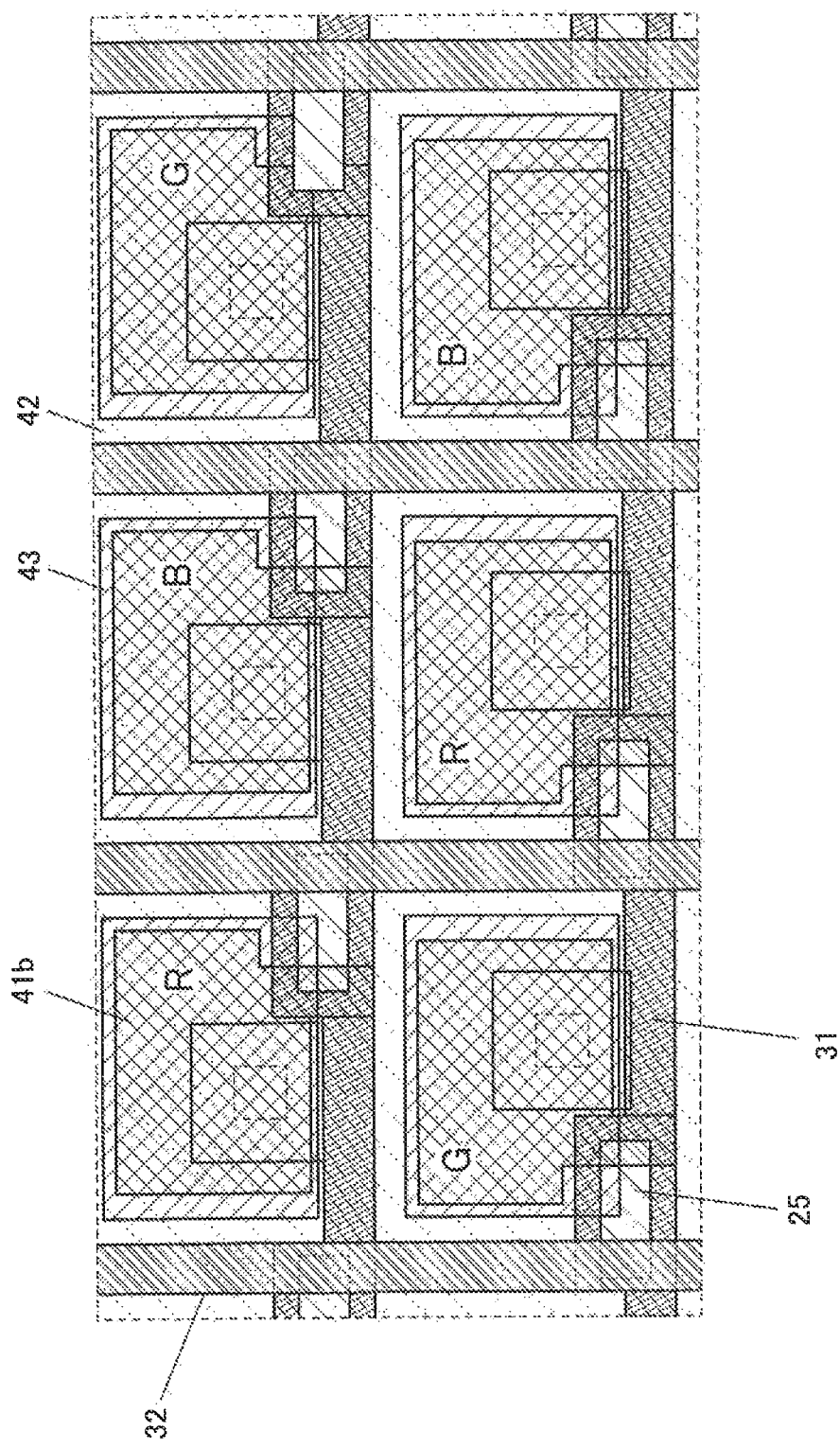
FIG. 18 illustrates pixel layout.

FIG. 18 is a top view illustrating an example of arrangement where the pixels 10a are used as subpixels. In FIG. 18, R, G, and B represent examples of colors of the coloring layer 65 provided over the subpixels. It is preferable to arrange the pixels while inverting pixel layout row by row so that the viewing angle dependence can be reduced. Note that similar arrangement is applicable to the pixels 10b, 10c, and 10d.

Next, the details of materials and the like that can be used for components of the display device in this embodiment are described. Note that description of the components already described is omitted in some cases. Materials described below can be used as appropriate for a display device, a touch panel, and components thereof to be described later.

<Substrates 71 and 72>

There are no large limitations on the material of the substrate used in the display device in one embodiment of the present invention; a variety of substrates can be used. For example, a glass substrate, a quartz substrate, a sapphire substrate, a semiconductor substrate, a ceramic substrate, a metal substrate, a plastic substrate, or the like can be used.

The weight and thickness of the display device can be reduced by using a thin substrate. Furthermore, a flexible display device can be obtained by using a substrate that is thin enough to have flexibility.

The display device in one embodiment of the present invention is manufactured by forming a transistor and the like over a manufacture substrate and then transferring the transistor and the like on another substrate. The use of the manufacture substrate enables the following: formation of a transistor with favorable characteristics; formation of a transistor with low power consumption; manufacture of a durable display device, addition of heat resistance to the display device, a reduction of the weight of the display device, or a reduction of the thickness of the display device. Examples of a substrate to which a transistor is transferred include, in addition to the substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate.

<Transistors 21, 22, 23, and 24>

Each transistor included in the display device in one embodiment of the present invention may have a top-gate structure or a bottom-gate structure. Gate electrodes may be provided above and below a channel. A semiconductor material used for the transistor is not particularly limited, and an oxide semiconductor, silicon, or germanium can be used, for example.

There is no particular limitation on the crystallinity of the semiconductor material used for the transistor, and an amorphous semiconductor or a crystalline semiconductor (a microcrystalline semiconductor, a polycrystalline semiconductor, a single-crystal semiconductor, or a semiconductor partly including crystal regions) may be used. The use of a crystalline semiconductor is preferable because degradation of transistor characteristics can be reduced.

For example, a Group 14 element, a compound semiconductor, or an oxide semiconductor can be used for the semiconductor layer. Typically, a semiconductor including silicon, a semiconductor including gallium arsenide, an oxide semiconductor including indium, or the like can be used for the semiconductor layer.

An oxide semiconductor is preferably used for a semiconductor where a channel of a transistor is formed. In particular, the use of an oxide semiconductor with a larger bandgap than that of silicon is preferable. The use of a semiconductor material with a larger bandgap than that of silicon and low carrier density is preferable because off-state current of the transistor can be reduced.

The use of such an oxide semiconductor makes it possible to provide a highly reliable transistor with a small change in electrical characteristics.

Charge accumulated in a capacitor through the transistor can be retained for a long time because of low off-state current of the transistor. The use of such a transistor in pixels allows a driver circuit to stop while the gray level of an image displayed is maintained. As a result, a display device with extremely low power consumption can be obtained.

The transistors 21, 22, 23, and 24 preferably each include an oxide semiconductor layer that is highly purified to suppress formation of oxygen vacancies. Accordingly, the off-state current of the transistor can be made low. Therefore, an electrical signal such as an image signal can be held for a long time, and a writing interval can be set long in an on state. Consequently, the frequency of refresh operation can be reduced, which leads to an effect of reducing power consumption.

In the transistors 21, 22, 23, and 24, comparatively high field-effect mobility can be obtained, so that high-speed operation is possible. The use of such transistors capable of high-speed operation in the display device enables formation of the transistor in the display portion and the transistor in the driver circuit portion over the same substrate. This means that a semiconductor device separately formed using a silicon wafer or the like does not need to be used as the driver circuit, which enables a reduction in the number of components in the display device. In addition, by using the transistor capable of high-speed operation in the pixel portion, a high-quality image can be provided.

<Insulating Layer>

An organic insulating material or an inorganic insulating material can be used as an insulating material that can be used for each insulating layer, a spacer, or the like included in the display device. Examples of the organic insulating material include an acrylic resin, an epoxy resin, a polyimide resin, a polyamide resin, a polyimide amide resin, a siloxane resin, a benzocyclobutene-based resin, and a phenol resin. Examples of an inorganic insulating layer include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

<Conductive Layer>

For a gate, a source, and a drain of a transistor and a conductive layer such as a wiring or an electrode included in the display device, a single-layer structure or a stacked structure including any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which a titanium film or a titanium nitride film, an aluminum film or a copper film, and a titanium film or a titanium nitride film are stacked in that order; a three-layer structure in which a molybdenum film or a molybdenum nitride film, an aluminum film or a copper film, and a molybdenum film or a molybdenum nitride film are stacked in that order; or the like can be employed. For example, in the case where the conductive layer has a three-layer structure, it is preferable that each of first and third layers be a film formed using titanium, titanium nitride, molybdenum, tungsten, an alloy containing molybdenum and tungsten, an alloy containing molybdenum and zirconium, or molybdenum nitride, and that a second layer be a film formed using a low-resistance material such as copper, aluminum, gold, silver, or an alloy containing copper and manganese. Note that a light-transmitting conductive material such as ITO, indium oxide containing tungsten oxide, indium zinc oxide containing tungsten oxide, indium oxide containing titanium oxide, indium tin oxide containing titanium oxide, indium zinc oxide, or ITSO may be used.

Note that an oxide conductive layer may be formed by controlling the resistivity of the oxide semiconductor.

<Adhesive Layer 73>

A curable resin such as a thermosetting resin, a photocurable resin, or a two-component type curable resin can be used for the adhesion layer 73. For example, an acrylic resin, a urethane resin, an epoxy resin, or a siloxane resin can be used.

<Connector 45>

As the connector 45, for example, an anisotropic conductive film (ACF) or an anisotropic conductive paste (ACP) can be used.

<Coloring Layer 65>

The coloring layer 65 is a colored layer that transmits light in a specific wavelength range. Examples of a material that can be used for the coloring layer 65 include a metal material, a resin material, and a resin material containing a pigment or dye.

<Light-Blocking Layer 66>

The light-blocking layer 66 is positioned between adjacent coloring layers 65 for different colors. A black matrix formed using, for example, a metal material or a resin material containing a pigment or dye can be used as the light-blocking layer 66. Note that it is preferable to provide the light-blocking layer 66 also in a region other than the display portion 162, such as the driver circuit portion 164, because leakage of guided light or the like can be inhibited.

Note that thin films included in the display device (e.g., insulating films, semiconductor films, or conductive films) can be formed by any of sputtering, chemical vapor deposition (CVD), vacuum deposition, pulsed laser deposition (PLD), atomic layer deposition (ALD), or the like. Examples of CVD include plasma-enhanced CVD (PECVD) and thermal CVD. Examples of thermal CVD include metal organic CVD (MOCVD).

Alternatively, the thin films included in the display device (e.g., the insulating films, semiconductor films, or conductive films) can be formed by a method such as spin coating, dipping, spray coating, inkjet printing, dispensing, screen printing, or offset printing, or with a doctor knife, a slit coater, a roll coater, a curtain coater, or a knife coater.

The thin films included in the display device can be processed using photolithography or the like. Alternatively, island-shaped thin films may be formed by a deposition method using a blocking mask. Alternatively, the thin films may be processed by nano-imprinting, sandblasting, lift-off, or the like. Examples of photolithography include a method in which a resist mask is formed over a thin film to be processed, the thin film is processed by etching or the like, and the resist mask is removed, and a method in which a photosensitive thin film is formed, and the photosensitive thin film is exposed to light and developed to be processed in a desired shape.

As light for exposure in photolithography, light with an i-line (with a wavelength of 365 nm), light with a g-line (with a wavelength of 436 nm), light with an h-line (with a wavelength of 405 nm), and light in which the i-line, the g-line, and the h-line are mixed can be used. Alternatively, ultraviolet light, KrF laser light, ArF laser light, or the like can be used. Exposure may be performed by an immersion exposure technique. As light for exposure, extreme ultraviolet light (EUV), X-rays, or the like can be used. An electron beam can be used instead of light for exposure. It is preferable to use EUV, X-rays, or an electron beam because extremely fine processing can be performed. Note that when exposure is performed by scanning of a beam such as an electron beam, a photomask is not needed.

For etching of the thin film, dry etching, wet etching, sandblasting, or the like can be used.

As a result, it is possible to manufacture a liquid crystal display device with high aperture ratio and low power consumption.

This embodiment can be combined with any of the other embodiments as appropriate.

Embodiment 2

In this embodiment, an operation mode that can be employed in the display device in one embodiment of the present invention is described with reference to FIGS. 19A to 19C.

A normal driving mode with normal frame frequency (typically, higher than or equal to 60 Hz and lower than or equal to 240 Hz) and an idling stop (IDS) driving mode with low frame frequency are described below.

Note that the IDS driving mode refers to a method in which after image data is written, rewriting of image data is stopped. This increases the interval between writing of image data and subsequent writing of image data, so that power that would be consumed by writing of image data in that interval can be reduced. The IDS driving mode can be performed at frame frequency that is 1/100 to 1/10 of the normal driving mode, for example. A still image is displayed by the same video signals in consecutive frames. Thus, the IDS driving mode is particularly effective when displaying a still image. When an image is displayed using IDS driving, power consumption is reduced, image flickering is suppressed, and eyestrain can be reduced.

Figure 19A:
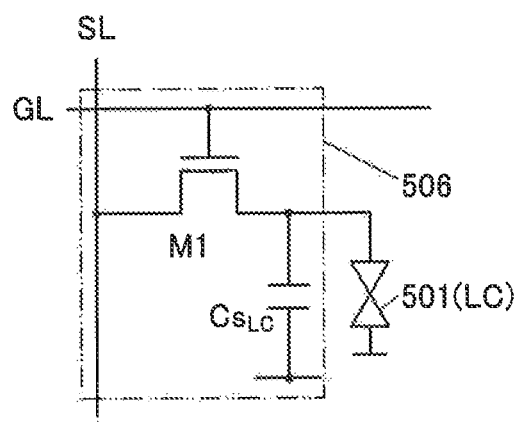
FIGS. 19A to 19C illustrate examples of an operation mode.
Figure 19B:
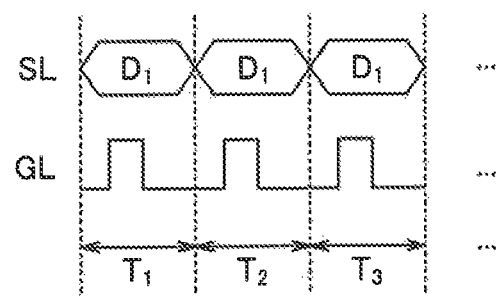
Figure 19C:
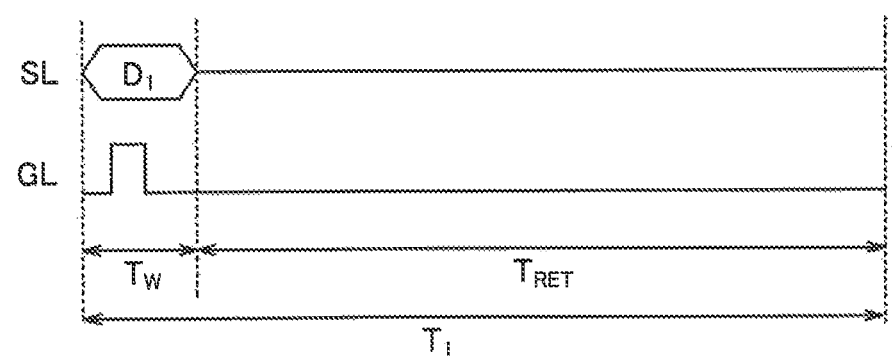

FIGS. 19A to 19C are a circuit diagram of a pixel circuit and timing charts illustrating the normal driving mode and the IDS driving mode. Note that in FIG. 19A, a liquid crystal element 501 and a pixel circuit 506 electrically connected to the liquid crystal element 501 are illustrated. In the pixel circuit 506 in FIG. 19A, a signal line SL, a gate line GL, a transistor M1 connected to the signal line SL and the gate line GL, and a capacitor CsLc connected to the transistor M1 are illustrated.

The transistor M1 might become a leakage path of data $D_1$. Thus, the off-state current of the transistor M1 is preferably as low as possible. A transistor including a metal oxide in a semiconductor layer where a channel is formed is preferably used as the transistor M1. A metal oxide having at least one of an amplification function, a rectification function, and a switching function can be referred to as a metal oxide semiconductor or an oxide semiconductor (abbreviated to an OS). As a typical example of a transistor, a transistor including an oxide semiconductor in a semiconductor layer where a channel is formed (such a transistor is also referred to as an OS transistor) is described below. The OS transistor has extremely low leakage current in an off state (off-state current) compared to a transistor including polycrystalline silicon or the like. Note that a node to which a pixel electrode of the liquid crystal element 501, one of a source and a drain of the transistor M1, and the capacitor $C_{SLC}$ are connected is referred to as a node ND1. Charge supplied to the node ND1 can be retained for a long time when the OS transistor is used as the transistor M1.

In the circuit diagram in FIG. 19A, the liquid crystal element 501 also becomes a leakage path of the data $D_1$. Therefore, to perform IDS driving appropriately, the resistivity of the liquid crystal element 501 is preferably higher than or equal to $1.0 \times 10^{14}$ Ω·cm.

Note that for example, an In—Ga—Zn oxide or an In—Zn oxide can be suitably used for a channel region of the OS transistor. The In—Ga—Zn oxide can typically have an atomic ratio of In:Ga:Zn=4:2:4.1 or a neighborhood thereof.

FIG. 19B is a timing chart showing waveforms of signals supplied to the signal line SL and the gate line GL in the normal driving mode. In the normal driving mode, normal frame frequency (e.g., 60 Hz) is used for operation. Periods $T_1$ to $T_3$ are shown in FIG. 19B. A scan signal is supplied to the gate line GL in each frame period and the data $D_1$ is written from the signal line SL to the liquid crystal element 501 and the capacitor $C_{SLC}$. This operation is performed both to write the same data $D_1$ in the periods $T_1$ to $T_3$ and to write different data in the periods $T_1$ to $T_3$.

In contrast, FIG. 19C is a timing chart showing waveforms of signals supplied to the signal line SL and the gate line GL in the IDS driving mode. In the IDS driving, low frame frequency (e.g., 1 Hz) is used for operation. One frame period is denoted by a period $T_1$ and includes a data writing period $T_W$ and a data retention period $T_{RET}$. In the IDS driving mode, a scan signal is supplied to the gate line GL and the data $D_1$ of the signal line SL is written in the period $T_W$, the gate line GL is fixed to low-level voltage in the period $T_{RET}$, and the transistor M1 is turned off so that the written data $D_1$ is retained. Note that the low frame frequency may be higher than or equal to 0.1 Hz and lower than 60 Hz, for example.

The IDS driving mode can reduce power consumption.

This embodiment can be combined with any of the other embodiments as appropriate.

Embodiment 3

A metal oxide that can be used for a semiconductor layer of a transistor disclosed in one embodiment of the present invention is described in this embodiment. Note that when a metal oxide is used for a semiconductor layer of a transistor, the metal oxide may be referred to as an oxide semiconductor.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

A cloud-aligned composite oxide semiconductor (CAC-OS) may be used for the semiconductor layer of the transistor disclosed in one embodiment of the present invention.

Note that the non-single-crystal oxide semiconductor or the CAC-OS can be suitably used for the semiconductor layer of the transistor disclosed in one embodiment of the present invention. In addition, the nc-OS or the CAAC-OS can be suitably used as the non-single-crystal oxide semiconductor.

Note that in one embodiment of the present invention, the CAC-OS is preferably used for the semiconductor layer of the transistor. The use of the CAC-OS can provide high electrical characteristics or high reliability of the transistor.

Details of the CAC-OS are described below.

The CAC-OS or a CAC metal oxide has a conducting function in part of a material and has an insulating function in another part of the material; as a whole, the CAC-OS or the CAC metal oxide functions as a semiconductor. In the case where the CAC-OS or the CAC metal oxide is used for a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the conducting function, and the insulating regions have the insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred in some cases.

Furthermore, in the CAC-OS or the CAC metal oxide, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS or the CAC metal oxide includes components having different bandgaps. For example, the CAC-OS or the CAC metal oxide includes a component having a wide gap due to an insulating region and a component having a narrow gap due to a conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the CAC-OS or the CAC metal oxide is used for a channel formation region of a transistor, high current drive capability in the on state of the transistor, that is, high on-state current and high field-effect mobility, can be obtained.

In other words, a CAC-OS or a CAC-metal oxide can be called a matrix composite or a metal matrix composite.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed in regions each having a size of greater than or equal to 0.5 nm and less than or equal to 10 nm, preferably greater than or equal to 1 nm and less than or equal to 2 nm, or a similar size and the regions including the one or more metal elements are mixed is referred to as a mosaic pattern or a patch-like pattern.

Note that the metal oxide preferably contains at least indium. In particular, indium and zinc are preferably contained. In addition, one or more elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, or the like may be contained.

As an example of the CAC-OS, an In—Ga—Zn oxide with the CAC composition (such an In—Ga—Zn oxide may be particularly referred to as CAC-IGZO) is described. The CAC-IGZO has a composition with a mosaic pattern in which materials are separated into indium oxide ($InO_{X1}$, where X1 is a real number greater than 0) or indium zinc oxide ($In_{X2}Zn_{Y2}O_{Z2}$, where X2, Y2, and Z2 are each a real number greater than 0) and gallium oxide ($GaO_{X3}$, where X3 is a real number greater than 0) or gallium zinc oxide ($Ga_{X4}Zn_{Y4}O_{Z4}$, where X4, Y4, and Z4 are each a real number greater than 0), for example. Furthermore, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is higher than the atomic ratio of In to the element M in a second region, the first region has higher In concentration than the second region.

Note that a compound containing In, Ga, Zn, and O is also commonly known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in the a-b plane direction without alignment.

In contrast, the CAC-OS relates to the material composition of a metal oxide. In part of the material composition of a CAC-OS containing In, Ga, Zn, and O, nanoparticle regions including Ga as a main component and nanoparticle regions including In as a main component are observed. These nanoparticle regions are randomly dispersed in a mosaic pattern. Therefore, the crystal structure is a secondary element for the CAC-OS.

Note that the CAC-OS does not include a stacked structure of two or more films with different compositions. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In part of the composition of a CAC-OS that contains, instead of gallium, one or more metal elements selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, or the like, nanoparticle regions including the one or more metal elements as a main component and nanoparticle regions including In as a main component are observed. These nanoparticle regions are randomly dispersed in a mosaic pattern.

The CAC-OS can be formed by sputtering under a condition where a substrate is not heated intentionally, for example. In the case where the CAC-OS is formed by sputtering, one or more gases selected from an inert gas (typically, argon), an oxygen gas, or a nitrogen gas may be used as a deposition gas. The percentage of the oxygen gas flow rate in the total flow rate of the deposition gas at the time of deposition is preferably as low as possible; for example, the percentage of the oxygen gas flow rate is preferably higher than or equal to 0% and lower than 30%, more preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS that is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in the plan-view direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region including $GaO_{X3}$ as a main component and the region including $In_{X2}Zn_{Y2}O_{X2}$ or $InO_{X1}$ as a main component are unevenly distributed and mixed.

The CAC-OS has a structure and characteristics different from those of an IGZO compound in which metal elements are evenly distributed. That is, in the CAC-OS, regions including $GaO_{X3}$ or the like as a main component and regions including $In_{X2}Zn_{Y2}O_{Z2}$ or $InO_{X1}$ as a main component are phase-separated from each other in a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the oxide semiconductor exhibits conductivity. Accordingly, when the regions including $In_{X2}Zn_{Y2}O_{Z2}$ or $InO_{X1}$ as a main component are distributed in the oxide semiconductor like a cloud, high field-effect mobility (μ) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the regions including $GaO_{X3}$ or the like as a main component are distributed in the oxide semiconductor, leakage current can be reduced and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current and high field-effect mobility (μ) can be achieved.

A semiconductor element including a CAC-OS has high reliability. Thus, the CAC-OS is suited for a variety of semiconductor devices typified by a display.

This embodiment can be combined with any of the other embodiments as appropriate.

Embodiment 4

Examples of an electronic device that can use the display device in one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIGS. 20A to 20F illustrate specific examples of these electronic devices.

Figure 20A:
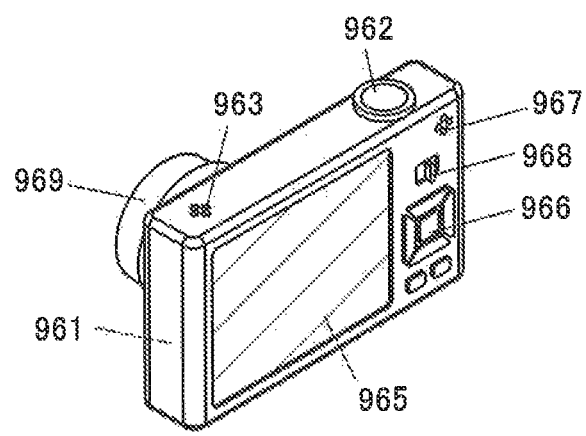
FIGS. 20A to 20F each illustrate an example of an electronic device.

FIG. 20A illustrates a digital camera, which includes a housing 961, a shutter button 962, a microphone 963, a speaker 967, a display portion 965, operation keys 966, a zoom lever 968, a lens 969, and the like. The display device in one embodiment of the present invention can be used for the display portion 965.

Figure 20B:
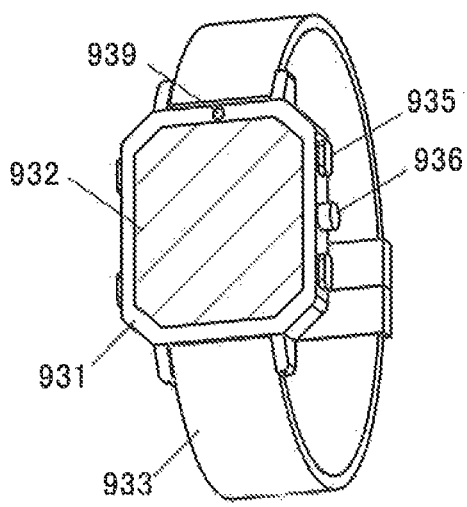

FIG. 20B illustrates a wrist-watch-type information terminal, which includes a housing 931, a display portion 932, a wristband 933, operation buttons 935, a winder 936, a camera 939, and the like. The display portion 932 may be a touch panel. The display device in one embodiment of the present invention can be used for the display portion 932.

Figure 20C:
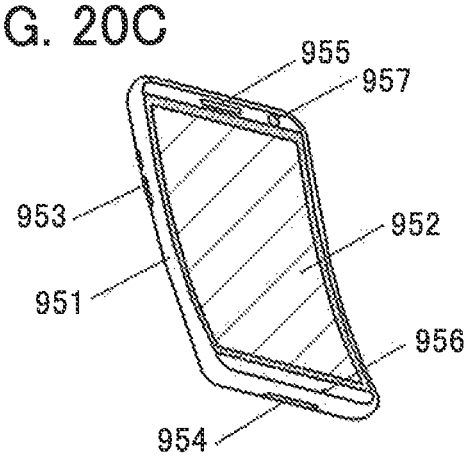

FIG. 20C illustrates an example of a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The display device in one embodiment of the present invention can be used for the display portion 952.

Figure 20D:
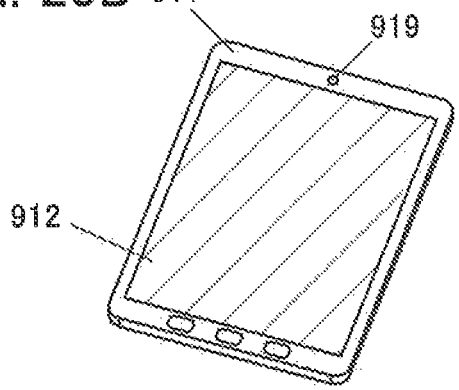

FIG. 20D illustrates a portable data terminal, which includes a housing 911, a display portion 912, a camera 919, and the like. A touch panel function of the display portion 912 enables input and output of information. The display device in one embodiment of the present invention can be used for the display portion 912.

Figure 20E:
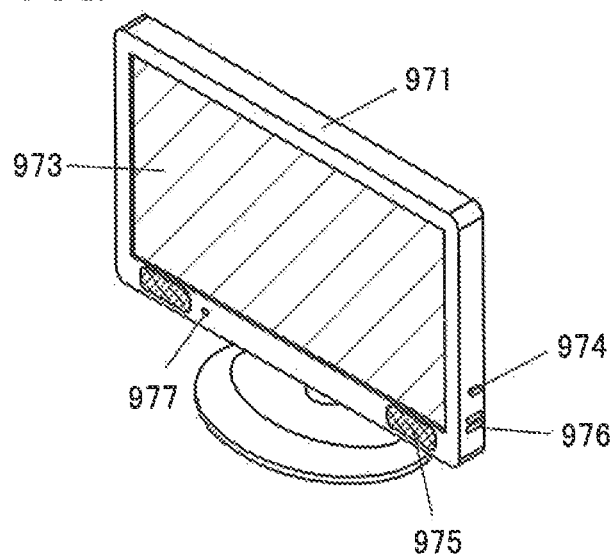

FIG. 20E is a television, which includes a housing 971, a display portion 973, an operation key 974, speakers 975, a communication connection terminal 976, an optical sensor 977, and the like. The display portion 973 includes a touch sensor that enables input operation. The display device in one embodiment of the present invention can be used for the display portion 973.

Figure 20F:
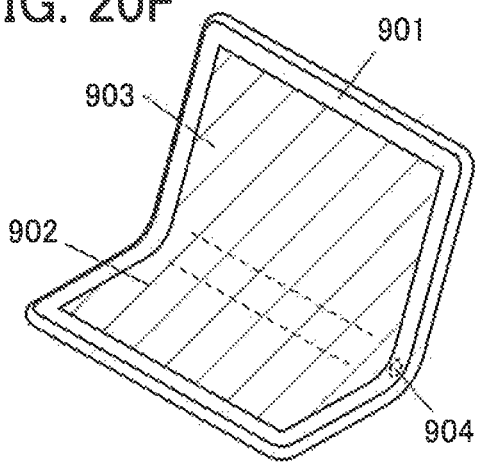

FIG. 20F illustrates an information processing terminal, which includes a housing 901, a display portion 902, a display portion 903, a sensor 904, and the like. The display portions 902 and 903 are formed using one display panel and flexible. The housing 901 is also flexible, can be used in a bent state as illustrated in FIG. 20F, and can be used in a flat plate-like shape like a tablet terminal. The sensor 904 can sense the shape of the housing 901, and for example, it is possible to switch display on the display portions 902 and 903 when the housing 901 is bent. The display device in one embodiment of the present invention can be used for the display portions 902 and 903.

This embodiment can be combined with any of the other embodiments as appropriate.

This application is based on Japanese Patent Application Serial No. 2016-227337 filed with Japan Patent Office on Nov. 23, 2016, the entire contents of which are hereby incorporated by reference.

What is claimed is:

1. A display device comprising:
a substrate;
an oxide semiconductor layer over the substrate;
a gate insulating layer over the oxide semiconductor layer;
a gate electrode over the gate insulating layer;
an insulating layer having an opening over the oxide semiconductor layer, the gate insulating layer, and the gate electrode;
a first conductive layer having a light-transmitting property over and in direct contact with the oxide semiconductor layer via the opening; and
a second conductive layer having a light-transmitting property overlapping with the first conductive layer,
wherein:
the first conductive layer comprises:
a region serving as a pixel electrode; and
a region serving as one of source and drain electrodes, and
the display device comprises a horizontal electric field-mode liquid crystal element.

2. The display device according to claim 1, wherein the first and second conductive layers each contain a metal oxide.

3. The display device according to claim 1, wherein the gate insulating layer is island-shaped.

4. A display device comprising:
a substrate;
an oxide semiconductor layer over the substrate;
a gate insulating layer over the oxide semiconductor layer;
a gate electrode over the gate insulating layer;
an insulating layer having an opening over the oxide semiconductor layer, the gate insulating layer, and the gate electrode;
a first conductive layer having a light-transmitting property over and in direct contact with the oxide semiconductor layer via the opening;
a second conductive layer having a light-transmitting property overlapping with the first conductive layer; and
a wiring electrically connected to the oxide semiconductor,
wherein:
the first conductive layer comprises:
a region serving as a pixel electrode; and
a region serving as one of source and drain electrodes,
the wiring comprises a region serving as the other of the source and drain electrodes, and
the display device comprises a horizontal electric field-mode liquid crystal element.

5. The display device according to claim 4, wherein the first and second conductive layers each contain a metal oxide.

6. The display device according to claim 4, wherein the gate insulating layer is island-shaped.

* * * * *